United States Patent
Kao et al.

(10) Patent No.: US 8,796,079 B2
(45) Date of Patent: Aug. 5, 2014

(54) PIXEL STRUCTURE AND FABRICATING METHOD THEREOF

(71) Applicant: Au Optronics Corporation, Hsinchu (TW)

(72) Inventors: Yih-Chyun Kao, Changhua County (TW); Hao-Lin Chiu, Taipei (TW); Chun-Nan Lin, Changhua County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/682,747

(22) Filed: Nov. 21, 2012

(65) Prior Publication Data
US 2013/0134489 A1 May 30, 2013

(30) Foreign Application Priority Data
Nov. 24, 2011 (TW) .............................. 100143135 A

(51) Int. Cl.
*H01L 29/66* (2006.01)
*H01L 27/12* (2006.01)
*H01L 29/786* (2006.01)

(52) U.S. Cl.
CPC ...... *H01L 29/66742* (2013.01); *H01L 27/1288* (2013.01); *H01L 29/78603* (2013.01)
USPC ........................................................ 438/158

(58) Field of Classification Search
CPC ..................... H01L 27/1214; H01L 21/31144
USPC ........................................................ 438/158
See application file for complete search history.

(56) References Cited

U.S. PATENT DOCUMENTS

| 6,255,130 | B1 | 7/2001 | Kim |
| 7,649,202 | B2 | 1/2010 | Lee |
| 2005/0287750 | A1 | 12/2005 | Lee |
| 2007/0063211 | A1 | 3/2007 | Iwasaki |
| 2009/0173943 | A1 | 7/2009 | Yu et al. |
| 2010/0301328 | A1 | 12/2010 | Yamazaki et al. |
| 2011/0068341 | A1* | 3/2011 | Li et al. ............... 257/59 |

FOREIGN PATENT DOCUMENTS

| CN | 1725273 | 1/2006 |
| CN | 101901839 | 12/2010 |

OTHER PUBLICATIONS

"First Office Action of China counterpart application" issued on Jul. 1, 2013, p. 1 p. 8.

* cited by examiner

*Primary Examiner* — Tran Tran
(74) *Attorney, Agent, or Firm* — Jianq Chyun IP Office

(57) ABSTRACT

A fabrication method of a pixel structure and a pixel structure are provided. A first patterned metal layer including scan lines and a gate is formed on a substrate. A first insulation layer, a semiconductor layer, an etching stop pattern and a metal layer are formed sequentially on the first patterned metal layer. The metal layer and the semiconductor layer are patterned to form a second patterned metal layer and a patterned semiconductor layer. The second patterned metal layer includes data lines, a source and a drain. The patterned semiconductor layer includes a first semiconductor pattern completely overlapping the second patterned metal layer and a second semiconductor pattern without overlapping the second patterned metal layer, wherein the second semiconductor pattern includes a channel pattern and a marginal pattern. The channel pattern is between the source and the drain and the marginal pattern surrounds the first semiconductor pattern.

11 Claims, 27 Drawing Sheets

PIXEL STRUCTURE AND FABRICATING METHOD THEREOF

CROSS-REFERENCE TO RELATED APPLICATION

This application claims the priority benefit of Taiwan application serial no. 100143135, filed on Nov. 24, 2011. The entirety of the above-mentioned patent application is hereby incorporated by reference herein and made a part of this specification.

BACKGROUND OF THE INVENTION

1. Field of the Invention

The invention relates to a pixel structure and a fabrication method thereof, and particularly, to a pixel structure having an etching stop pattern and a fabrication method of the pixel structure.

2. Description of Related Art

Nowadays, a multimedia technology has been well developed, which mostly benefits from the development of semiconductor devices and display apparatuses. As for displays, LCDs with advantages such as high definition, favorable space utilization, low power consumption and radiation-free operation have gradually become the mainstream of the market. In general, the thin film transistor liquid crystal display (TFT-LCD) is mainly assembled by a thin film transistor array substrate, a color filter substrate, and a liquid crystal (LC) layer sandwiched between the two substrates.

A known thin film transistor array includes scan lines, data lines, and pixel structures. In specific, the pixel structure includes a thin film transistor and a pixel electrode, wherein the thin film transistor electrically connects the pixel electrode to the corresponding scan line and the corresponding data line. The thin film transistor generally includes a gate connected to the scan line, the semiconductor layer located above the gate, the source and the drain located on the semiconductor layer, wherein the source is connected to the data line.

The film layers (including a metal layer, a semiconductor material layer, an insulation layer, etc.) deposited on the substrate are required to be patterned to form the needed component during fabricating the pixel structure. A known pixel structure is substantially consisted of a first metal layer, a first insulation layer, a semiconductor layer, a second metal layer, a second insulation layer, and a pixel electrode layer, wherein the first metal layer includes the scan line and the gate, and the second metal layer includes the data line, the source, and the drain. The five film layers besides the first insulation layer are respectively patterned so that a five mask process is provided for fabricating the known pixel structure.

In the five mask process, the semiconductor layer can be etched during etching the second metal layer. Accordingly, a method of forming an etching stop pattern on the semiconductor layer for protecting the semiconductor layer and serving the etching stop effect is provided. Thus, the fabrication of the pixel structure becomes a six mask process from the five mask process. The six mask process has the issue of high cost owing to an additional mask and further has the issue of the mis-alignment between the semiconductor layer and the etching stop pattern.

SUMMARY OF THE INVENTION

The invention provides a pixel structure and a fabrication method of a pixel structure, which uses the same mask process to fabricate the semiconductor layer and the second metal layer for reducing the numbers of the masks and improving the issue of alignment between the semiconductor layer and the etching stop pattern.

The invention is directed to a pixel structure and a fabrication method thereof. The fabrication method includes forming a first patterned metal layer on a substrate, and the first metal layer includes a scan line and a gate being connected to the scan line. A first insulation layer, a semiconductor layer, and an etching stop pattern are sequentially formed on the first patterned metal layer, wherein the etching stop pattern is located above the gate. Next, a metal layer is formed on the semiconductor layer and the etching stop pattern, and the metal layer and the semiconductor layer are patterned to form a second metal layer and a patterned semiconductor layer. The second patterned metal layer includes a data line, a source and a drain. An extension direction of the data line intersects an extension direction of the scan line. The source and the drain are opposite to each other and located on the etching stop pattern. The patterned semiconductor layer includes a first semiconductor pattern completely overlapped with the second patterned metal layer and a second semiconductor pattern not overlapped with the second patterned metal layer, wherein the second semiconductor pattern includes a channel pattern located between the source and the drain and a marginal pattern surrounding the first semiconductor pattern. Thereafter, a second insulation layer is formed on the substrate and a contact opening is formed therein for exposing the drain. A pixel electrode is then formed on the second insulation layer and the pixel electrode is connected to the drain via the contact opening.

According to an embodiment of the invention, the marginal pattern of the second semiconductor pattern continuously surrounds the periphery of the first semiconductor pattern.

According to an embodiment of the invention, an area of the patterned semiconductor layer is greater than an area of the second patterned metal layer.

According to an embodiment of the invention, the second patterned metal layer and the patterned semiconductor layer are in contact with each other.

According to an embodiment of the invention, a method of patterning the metal layer and the semiconductor layer includes forming a patterned photoresist layer on the metal layer and the semiconductor layer, wherein the patterned photoresist layer includes a first photoresist pattern and a second photoresist pattern, and a thickness of the first photoresist pattern is greater than a thickness of the second photoresist pattern. A first etching process is performed by using the patterned photoresist layer as a mask to remove an exposed portion of the metal layer and a portion of the semiconductor layer under the exposed portion of the metal layer for forming a pre-patterned metal layer and a patterned semiconductor layer. The second photoresist pattern is removed and the first photoresist pattern is thinned to form a third photoresist pattern exposing a portion of the pre-patterned metal layer. A second etching process is performed by using the third photoresist as a mask to remove the exposed portion of the pre-patterned metal layer for forming the second patterned metal layer. Next, the third photoresist pattern is removed. The pre-patterned metal layer pulls back relative to the patterned photoresist layer by a first distance and the patterned semiconductor layer pulls back relative to the pre-patterned metal layer by a second distance.

According to an embodiment of the invention, a width of the second photoresist pattern extended outward from the first photoresist pattern is greater than a sum of the first distance and the second distance.

According to an embodiment of the invention, a method of forming the patterned photoresist layer includes performing a photolithography process by using a photo mask to pattern a photoresist layer formed on the substrate and the photo mask includes a gray level mask, a half-tone mask, or a slit mask.

According to an embodiment of the invention, the photo mask has a first transparent region, a second transparent region, and a third transparent region having variant light transmittance. During performing the photolithography process, a light passes the first transparent region, the second transparent region, and the third transparent region to pattern the photoresist layer for respectively forming the first photoresist pattern and the second photoresist pattern.

According to an embodiment of the invention, the light transmittance of the second transparent region is ranged between the light transmittance of the first transparent region and the light transmittance of the third transparent region.

In view of the above, the same mask process is used for patterning the metal layer and the semiconductor layer according to the pixel structure and the fabrication method of the invention, and thus the conventional six mask process for fabricating the pixel structure having the etching stop pattern can be simplified as the five mask process of the invention. In addition, the semiconductor layer is not patterned before the formations of the etching stop pattern and the metal layer, and therefore, the shift between the semiconductor layer and the etching stop pattern existed in the conventional six mask process is prevented so that the alignment between the semiconductor layer and the etching stop pattern is proper.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

FIG. 1A through FIG. 7A are respectively schematic cross-sectional views taken along line A-A' depicted in FIG. 1 through FIG. 7.

FIG. 1B through FIG. 7B are respectively schematic cross-sectional views taken along line B-B' depicted in FIG. 1 through FIG. 7.

FIG. 1C through FIG. 7C are respectively schematic cross-sectional views taken along line C-C' depicted in FIG. 1 through FIG. 7.

FIG. 8A through FIG. 12A are respectively schematic cross-sectional views taken along line A-A' depicted in FIG. 8 through FIG. 12.

FIG. 8B through FIG. 12B are respectively schematic cross-sectional views taken along line B-B' depicted in FIG. 8 through FIG. 12.

FIG. 8C through FIG. 12C are respectively schematic cross-sectional views taken along line C-C' depicted in FIG. 8 through FIG. 12.

DESCRIPTION OF EMBODIMENTS

FIGS. 1 through 7 are schematic top views depicting the steps of a process for fabricating a pixel structure according to an embodiment of the present invention. FIG. 1A through FIG. 7A are respectively schematic cross-sectional views taken along line A-A' depicted in FIG. 1 through FIG. 7. FIG. 1B through FIG. 7B are respectively schematic cross-sectional views taken along line B-B' depicted in FIG. 1 through FIG. 7. FIG. 1C through FIG. 7C are respectively schematic cross-sectional views taken along line C-C' depicted in FIG. 1 through FIG. 7.

Figure 1:
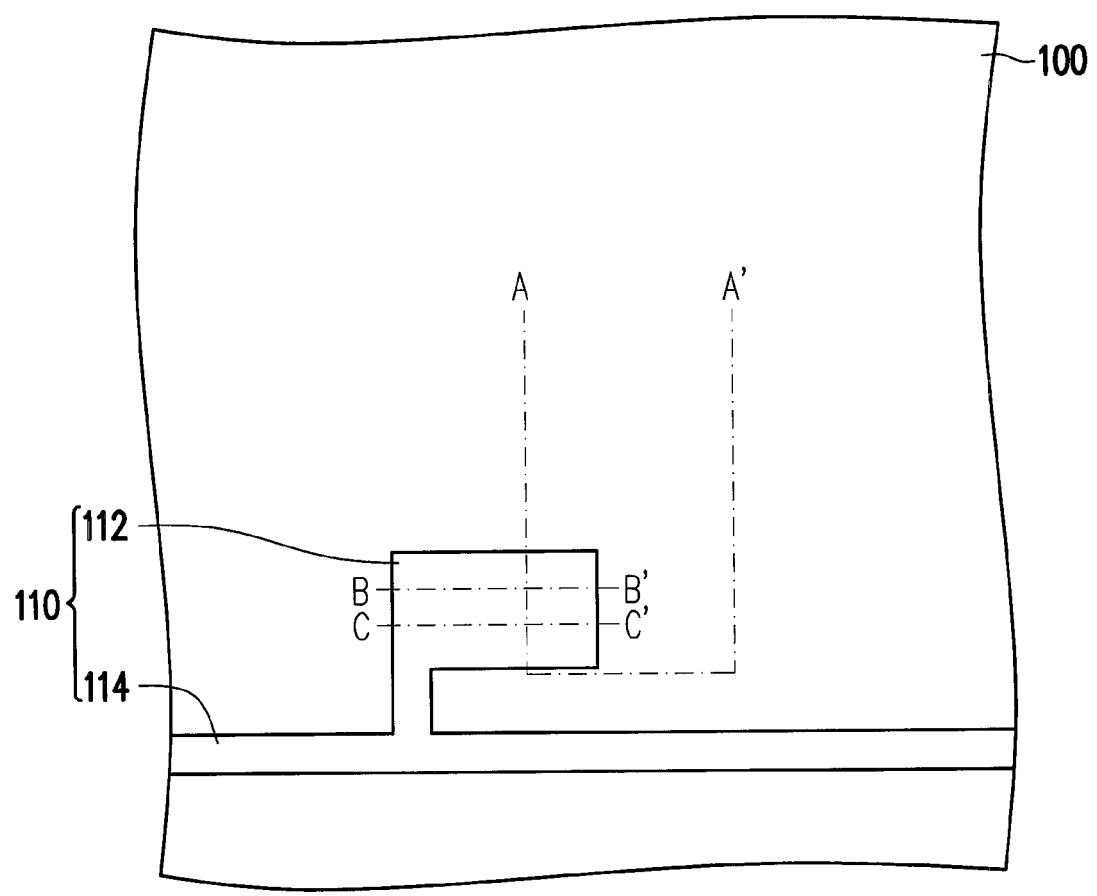
FIGS. 1 through 7 are schematic top views depicting the steps of a process for fabricating a pixel structure according to an embodiment of the present invention.
Figure 1A:
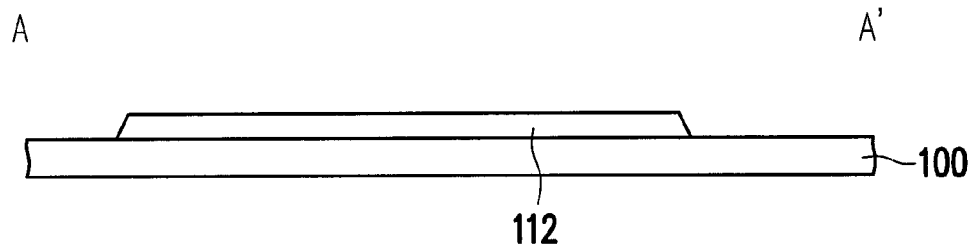
Figure 1B:
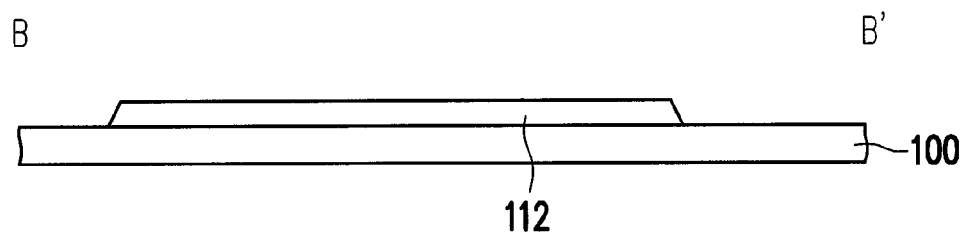
Figure 1C:
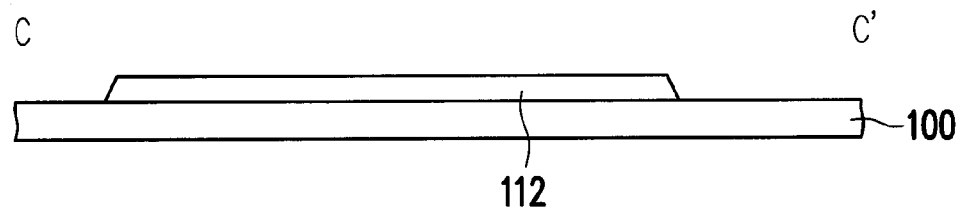

Referring to FIG. 1, a first patterned metal layer 110 is formed on a substrate 100, and includes a scan line 114 and a gate 112 being connected to the scan line 114. In the present embodiment, the first patterned metal layer 110 is, for example, formed by a stack of multiple metal layers or formed by a signal metal layer and a material thereof can be metal materials such as Al or Cu having good conductivity. In addition, referring to FIG. 1A through FIG. 1C, the patterns illustrated in the cross-sectional views taken along the lines A-A', B-B', and C-C' show the components constituted by the first pattern metal layer 110 stacked on the substrate 100. In an alternate example, the gate 112 can be formed by a portion of the scan line 114 itself, so that the first patterned metal layer 110 can has a linear pattern without the branched rectangle pattern (the gate 112) extended from the linear pattern (the scan line 114).

In specific, the first patterned metal layer 110 can be fabricated by a first mask process. In the first mask process, a metal material layer or multiple metal material layers stacking together can be firstly formed on the substrate 100. A photolithography and etching process is performed with use of a first photo mask (not shown), so as to pattern the metal material layer(s) for forming the first patterned metal layer 110. Nevertheless, the invention is not restricted thereto. In other embodiments, the first patterned metal layer 110 can be fabricated by using other methods such as printing process.

Figure 2:
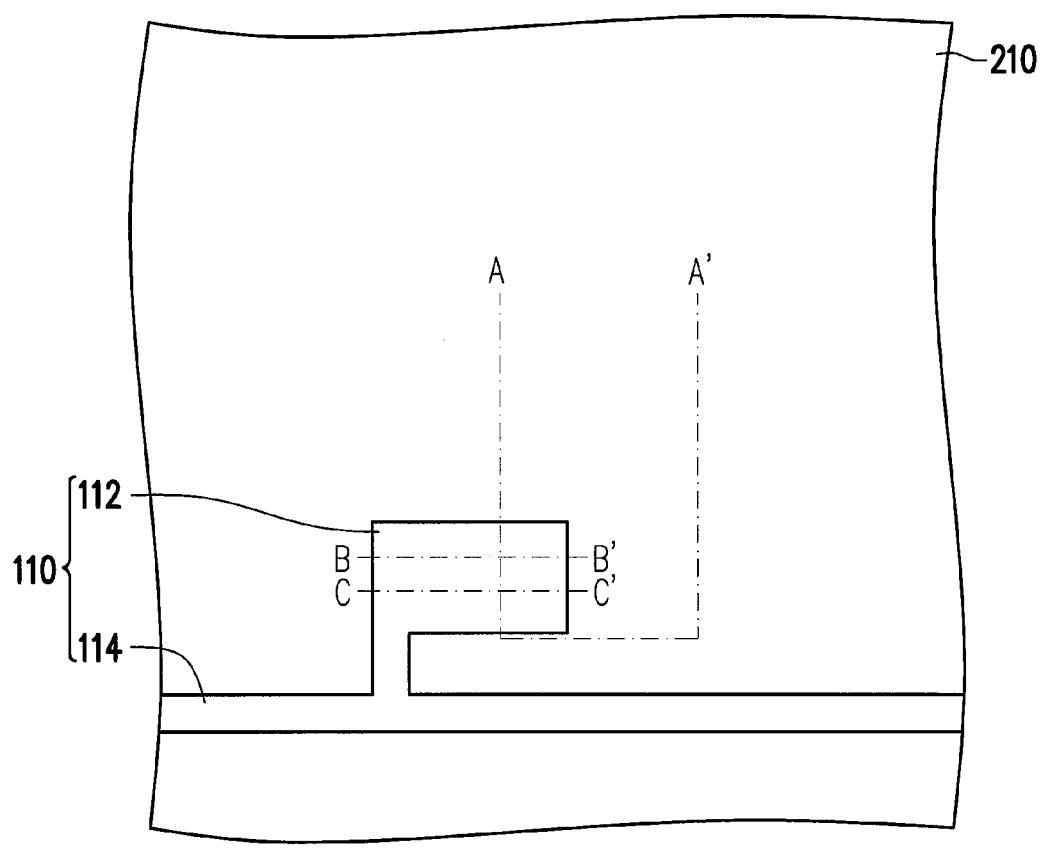
Figure 2A:
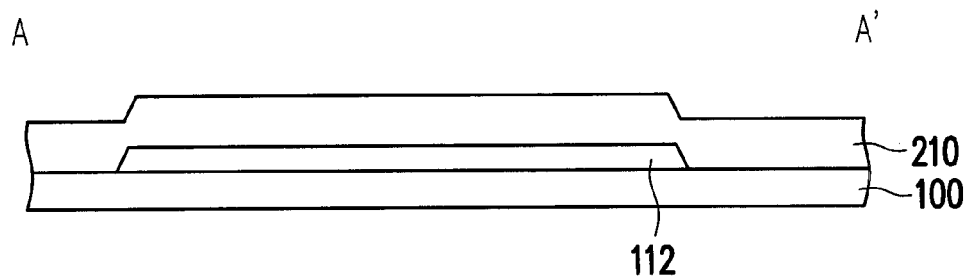
Figure 2B:
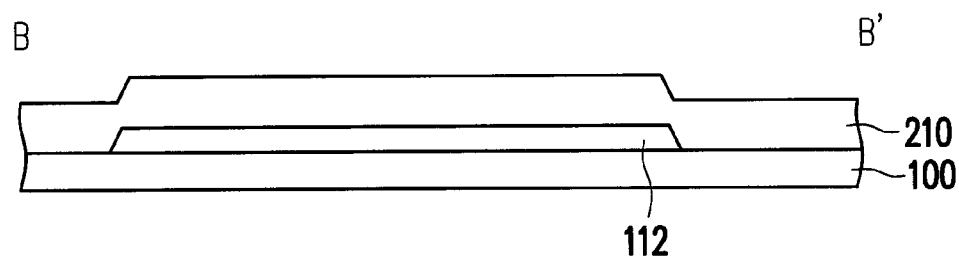
Figure 2C:
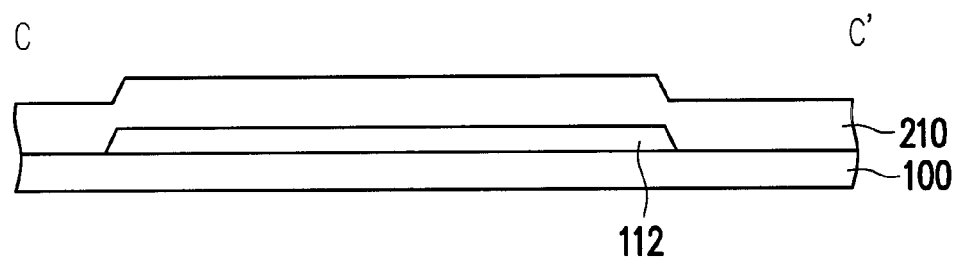

Referring to FIG. 2, a first insulation layer 210 having a material of silicon oxide, silicon nitride, or the like with high dielectric constant is formed on the first patterned metal layer 110 after the formation of the first patterned metal layer 110. As shown in FIG. 2A through FIG. 2C, the patterns illustrated in the cross-sectional views taken along the lines A-A', B-B', and C-C' are the gate 112 and the first insulation layer 210 sequentially stacked on the substrate 100, wherein the first insulation layer 210 completely covers the gate 112.

It is understood that the first insulation layer 210 completely covers on the substrate 110 and has no particular outline so that the top view of FIG. 2 does not mark the substrate 100. Similarly, in the following descriptions, among multiple film layers with substantially the same outline stacked together, merely the top one is marked in the top views of the drawings for descriptive purpose. Therefore, several components can be iterated in each of the top views of the following descriptions.

Figure 3:
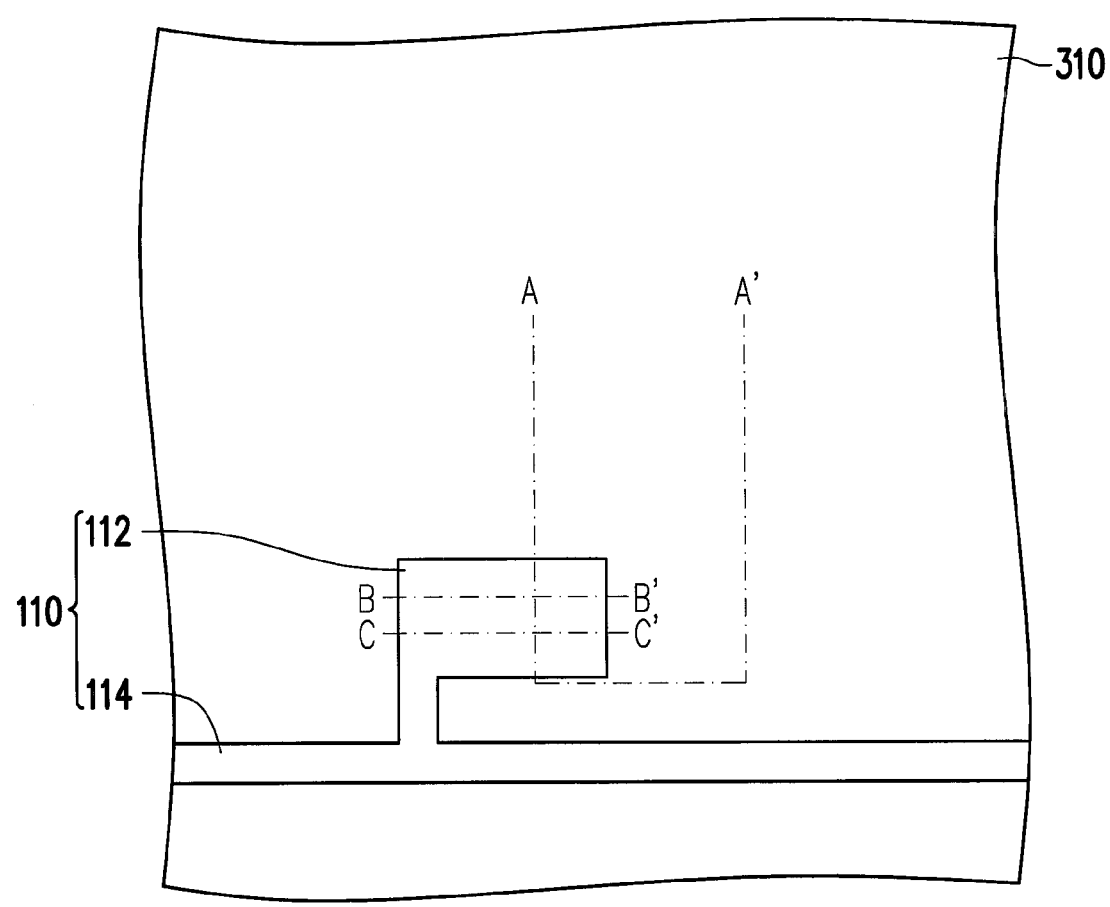
Figure 3A:
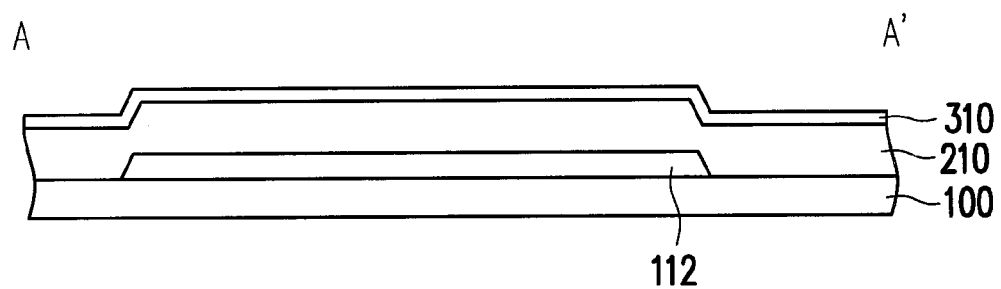
Figure 3B:
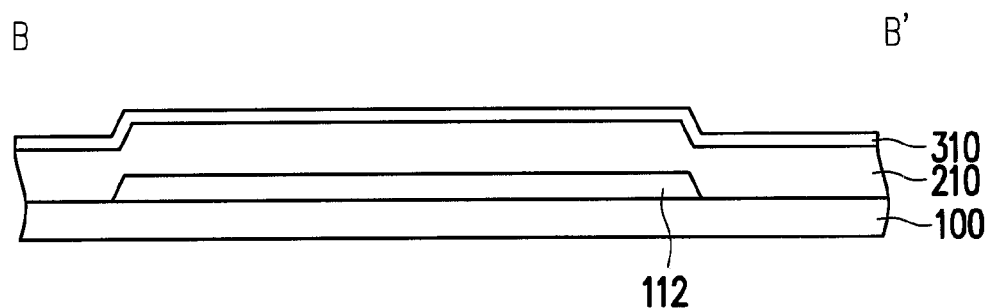
Figure 3C:
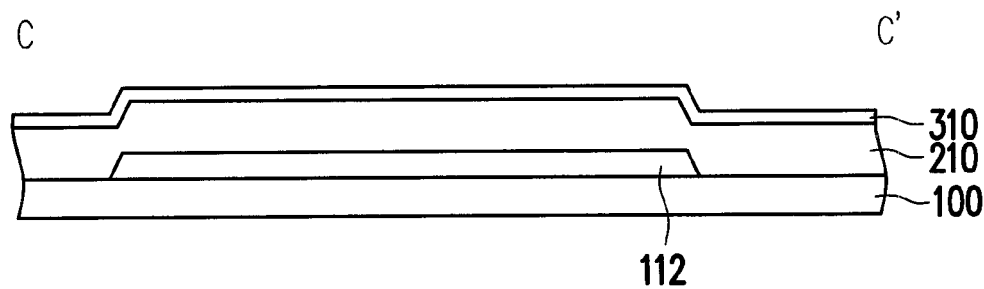

Referring to FIG. 3, after the formation of the first insulation layer 210, a semiconductor layer 310 is formed on the first insulation layer 210, wherein a material of the semiconductor layer 310 includes, for example, crystalline silicon semiconductor, amorphous silicon semiconductor, polycrystalline silicon semiconductor, oxide semiconductor, or the like. As shown in FIG. 3A through FIG. 3C, the patterns illustrated in the cross-sectional views taken along the lines A-A', B-B', and C-C' are the gate 210, the first insulation layer 210, and the semiconductor layer 310 sequentially stacked on the substrate 100, wherein the first semiconductor layer 310 completely covers on the first insulation layer 210.

Figure 4:
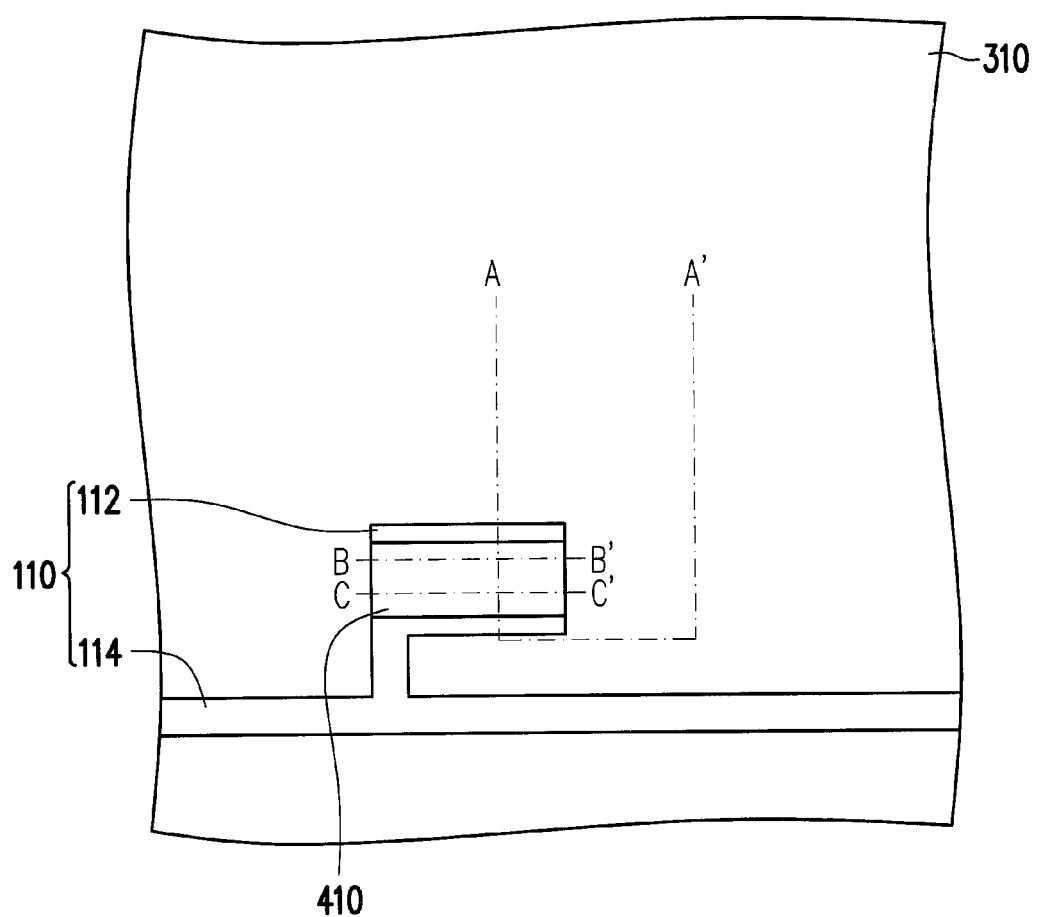

Referring to FIG. 4, after the formation of the semiconductor layer 310, an etching stop pattern 410 is formed above the gate 112, wherein the etching stop pattern 410 is used for protecting the semiconductor layer 310 and served as an etching stop of the etching process. A pattern of the etching stop pattern 410 can be a rectangle and a material of the etching stop pattern 410 can, for example, be silicon dioxide. In addition, the etching stop pattern 410 can be fabricated by a second mask process.

Figure 4A:
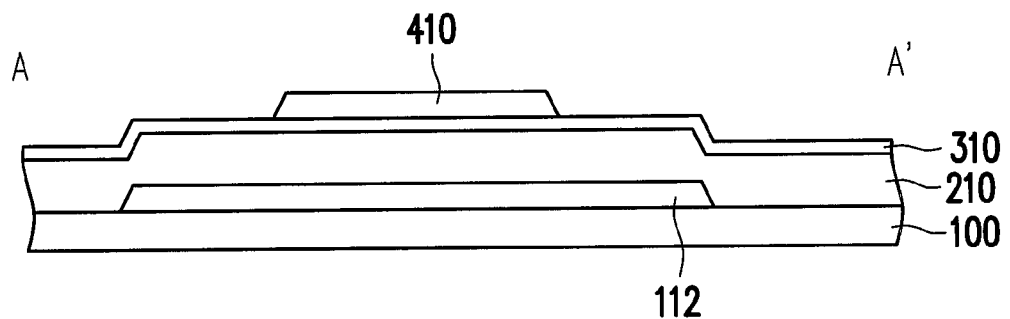
Figure 4B:
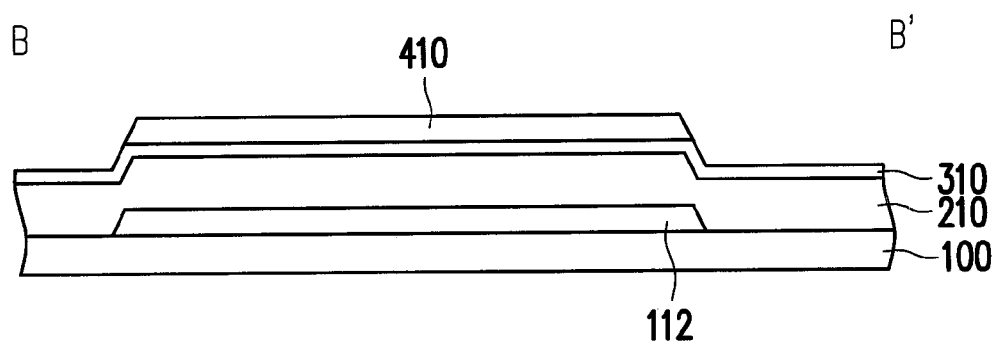
Figure 4C:
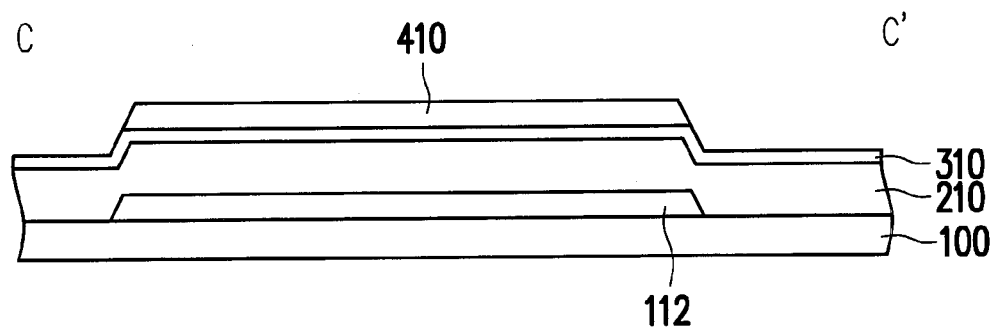

Referring to FIG. 4A through FIG. 4C, the pattern illustrated in the cross-sectional views taken along the lines A-A', B-B', and C-C' are the gate 112, the first insulation layer 210, the semiconductor layer 310, and the etching stop pattern 410 sequentially stacked on the substrate 100. Owing that the outline of the etching stop pattern 410 is a rectangle in the top view and the line A-A' is substantially parallel to the short length side of the rectangle, the width of the etching stop pattern 410 illustrated in FIG. 4A is shorter than the width of the etching stop pattern illustrated in FIG. 4B and FIG. 4C. However, the size and the outline of the etching stop pattern 410 can be modified and changed according to the design and the invention is not limited thereto.

Subsequently, referring to FIG. 5, after the formation of the etching stop pattern 410, a metal layer 510 is formed on the semiconductor layer 310 and the etching stop pattern 410, wherein the metal layer 510 can, for example, be a stack of multiple metal material layers or a signal metal material layer and the material of the metal layer 510 includes, for example, Al, Cu, and the material with good conductivity. As shown in FIG. 5A through FIG. 5C, the patterns illustrated in the cross-sectional views taken along the lines A-A', B-B', and C-C' are the gate 112, the first insulation layer 210, the semiconductor layer 310, the etching stop pattern 410, and the metal layer 510 sequentially stacked on the substrate 100, wherein the metal layer 510 completely covers on the semiconductor layer 310 and the etching stop pattern 410.

Next, a third mask process can be adopted in the present embodiment, so as to pattern the metal layer 510 and the semiconductor layer 310 to form the required components. The metal layer 510 and the semiconductor layer 310 can be patterned by using the same photo mask, and therefore, the method according to the present embodiment can reduce at least one mask process. In addition, the semiconductor layer 310 is not patterned before the formations of the etching stop pattern 410 and the metal layer 510, and therefore, the issue of the mis-alignment between the semiconductor layer 310 and the etching stop pattern 410 is avoided. It is noted that the detail of the third mask process is depicted after the following descriptions of the subsequent mask processes for descriptive purpose.

Figure 6:
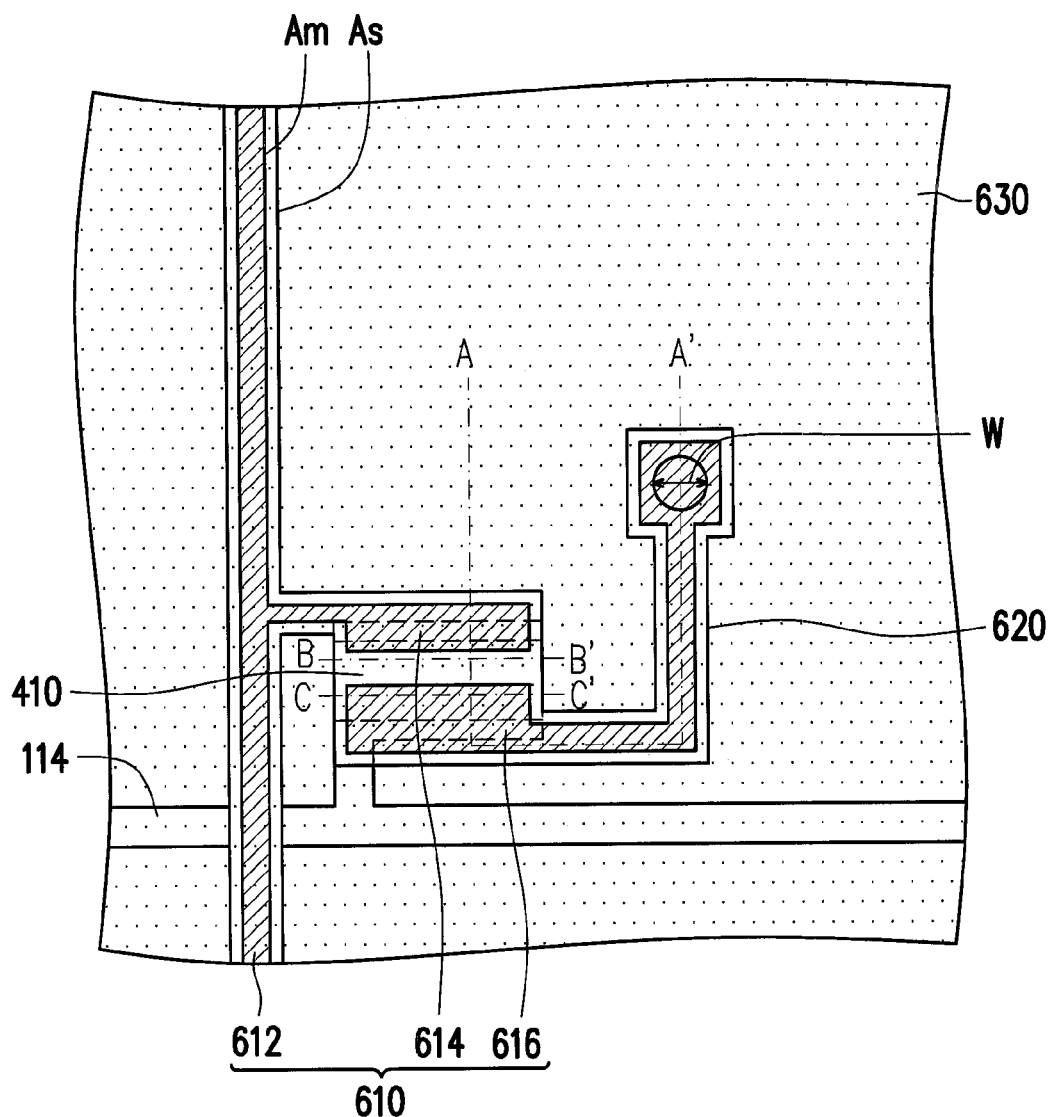

Accordingly, referring to FIG. 6, a second patterned metal layer 610 and a patterned semiconductor layer 620 are formed by patterning the metal layer 510 and the semiconductor layer 310 through performing the third mask process. The second patterned metal layer 610 and the patterned semiconductor layer 620 are substantially in contact with each other and an area As of the patterned semiconductor layer 620 is greater than an area Am of the second patterned metal layer 610. The second patterned metal layer 610 includes a data line 612, a source 614, and a drain 616. An extension direction of the data line 612 intersects an extension direction of the scan line 114. The source 614 and the drain 616 are opposite to each other and located on the etching stop pattern 410. The patterned semiconductor layer 620 includes a first semiconductor pattern 622 completely overlapped with the second patterned metal layer 610 and a second semiconductor pattern 624 not overlapped with the second patterned metal layer 610, wherein the second semiconductor pattern 624 includes a channel pattern 626 located between the source 614 and the drain 616 and a marginal pattern 628 surrounding the first semiconductor pattern 622.

Next, as shown in FIG. 6, a second insulation layer 630 is formed on the substrate 100 and a contact opening w is formed therein for exposing the drain 616. The second insulation layer 630, for example, completely covers the substrate 100 and has a material of silicon oxide with high dielectric constant. In the present embodiment, the fabrication method of the contact opening w can be a fourth mask process.

Figure 6A:
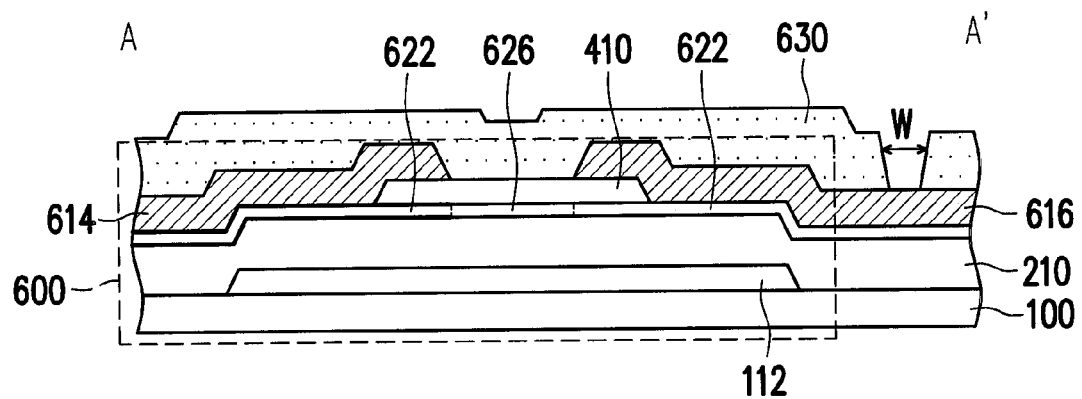
Figure 6B:
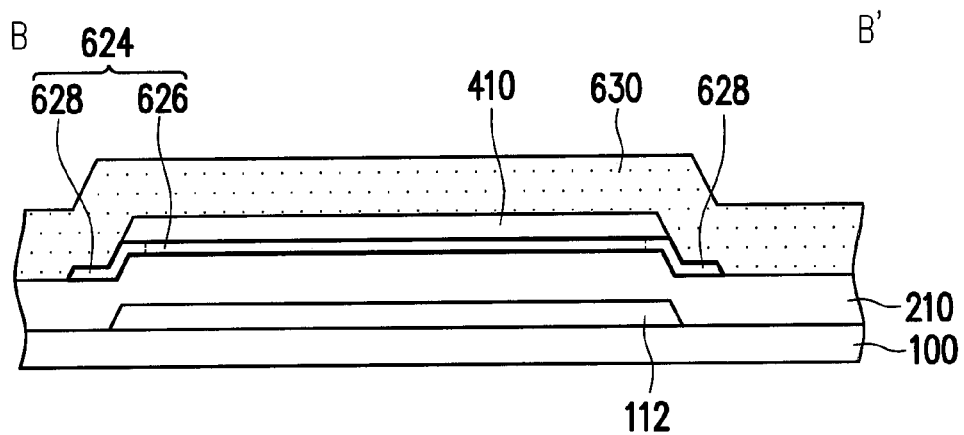
Figure 6C:
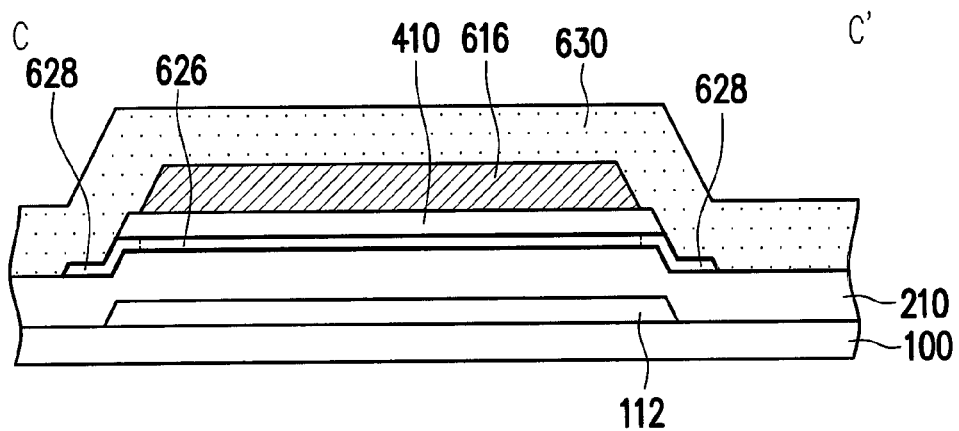
Figure 7:
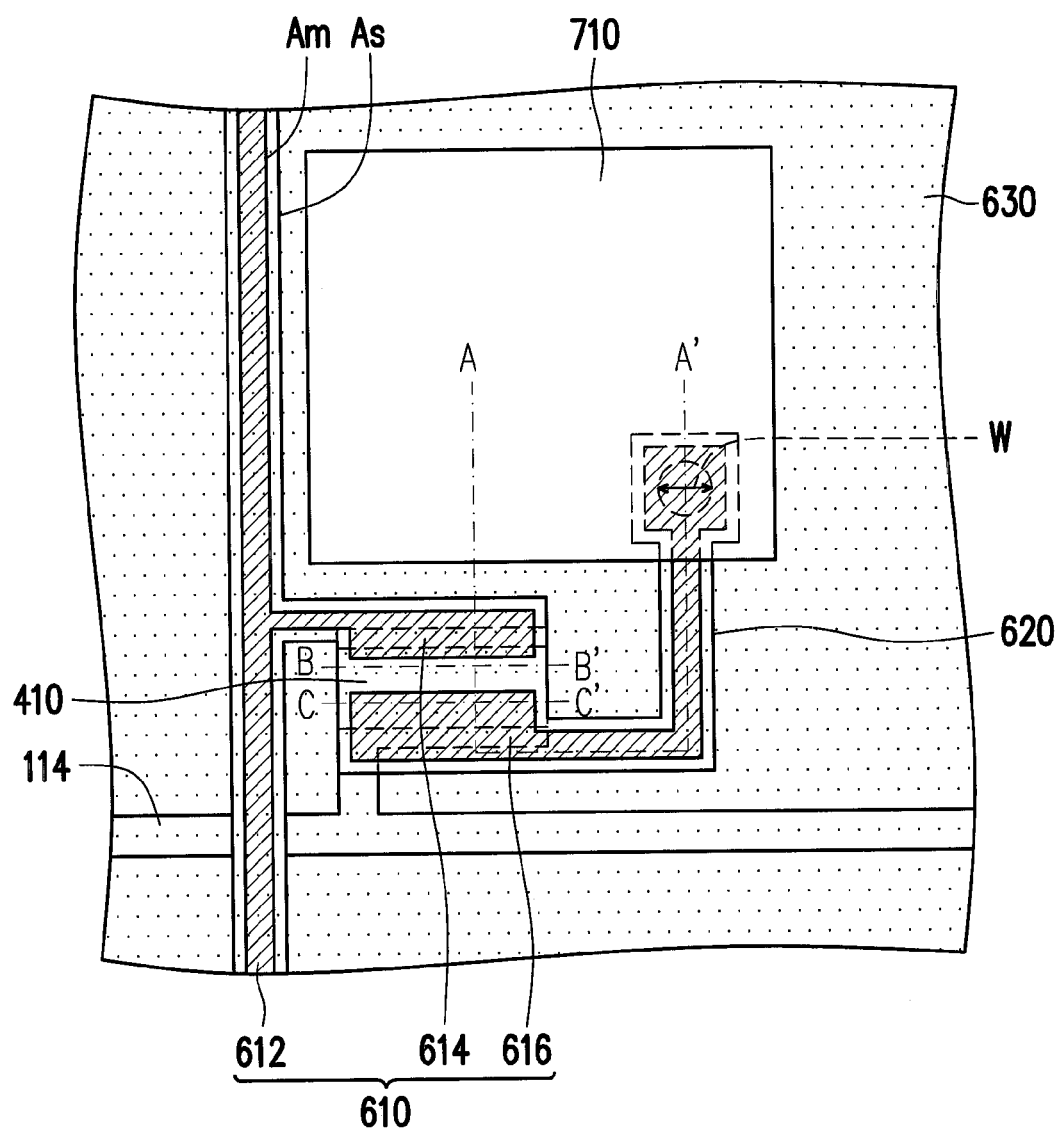
Figure 7A:
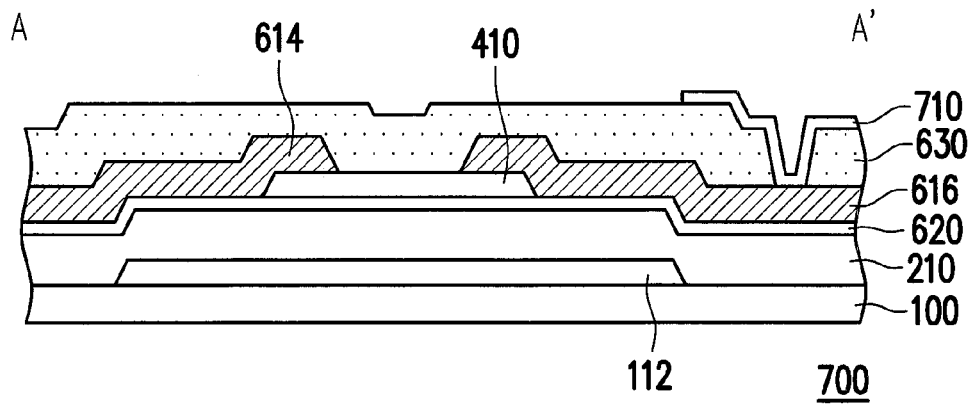
Figure 7B:
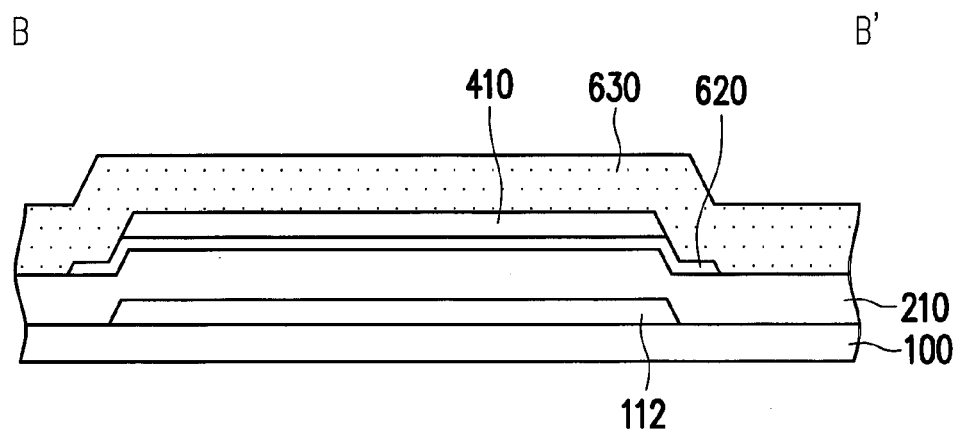
Figure 7C:
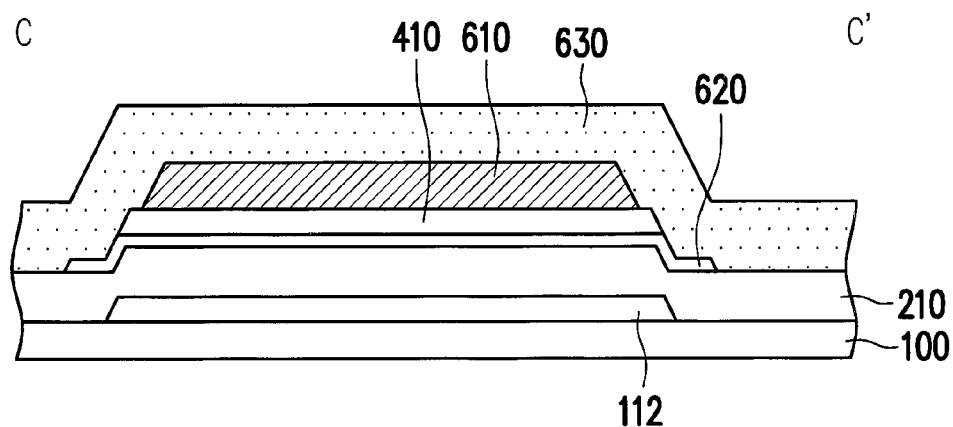

Referring in FIG. 6A, the pattern presented by the cross-sectional view along the line A-A' forms a thin film transistor 600 including the gate 112, the first insulation layer 210, a portion (the first semiconductor pattern 622 and the channel pattern 626) of the patterned semiconductor layer 620, the etching stop pattern 410, the source 614 and the drain 616, and the second insulation layer 630 sequentially stacked outward from the substrate 100. The contact opening w in the second insulation layer 630 exposes the drain 616.

It is noted that the area As of the patterned semiconductor layer 620 is greater than the area Am of the second patterned metal layer 610. The patterned semiconductor layer 620 is located between the second patterned metal layer 610 and the gate 112 so that in addition to the first insulation layer 210, the patterned semiconductor layer 620 is also disposed between the source 614 and the gate 112 and between the drain 616 and the gate 112, for increasing the distance between the source 614 and the gate 112 and between the drain 616 and the gate 112. Based on the relationship that a capacitance of a capacitor is inversely proportional to the gap between the two terminals in the capacitor, the parasitic capacitance Cgs between the source 614 and the gate 112 and the parasitic capacitance Cgd between the drain 616 and the gate 112 are reduced by the increasing of the distance therebetween. Accordingly, in addition to reduce the numbers of the photo masks adopted in the fabrication method, the design based on the present embodiment can further conduce to the reduction of the parasitic capacitances Cgs and Cgd in the thin film transistor 600.

Thereafter, referring to FIGS. 7 and 7A~7C, a pixel electrode 710 is formed on the second insulation layer 630 and the pixel electrode 710 is connected to the drain 616 via the contact opening w, wherein a material of the pixel electrode 710 includes indium tin oxide (ITO), indium zinc oxide (IZO), or the like. Now, the gate 112, the first insulation layer 210, the patterned semiconductor layer 620, the etching stop pattern 410, the source 614, the drain 616, the second insulation layer 630 and the pixel electrode 710 together form the pixel structure 700. In addition, the pixel electrode 710 can be fabricated by a fifth mask process.

The metal layer 510 and the semiconductor layer 310 can be patterned by using the same photo mask, and therefore, the method according to the present embodiment can use merely five mask processes to fabricate the pixel structure 700 having the etching stop pattern 410. In addition, the semiconductor layer 310 is not patterned before the formations of the etching stop pattern 410 and the metal layer 510, and therefore, the issue of the mis-alignment between the semiconductor layer 310 and the etching stop pattern 410 is avoided. Specifically, the third mask process of patterning the semiconductor layer and the metal layer to form the patterned semiconductor layer and the second patterned metal layer is further depicted in the following.

FIGS. 8 through 12 are schematic top views depicting the steps of a process for patterning the metal layer and the semiconductor layer according to an embodiment of the present invention. FIG. 8A through FIG. 12A are respectively schematic cross-sectional views taken along line A-A' depicted in FIG. 8 through FIG. 12. FIG. 8B through FIG. 12B are respectively schematic cross-sectional views taken along line B-B' depicted in FIG. 8 through FIG. 12. FIG. 8C through FIG. 12C are respectively schematic cross-sectional views taken along line C-C' depicted in FIG. 8 through FIG. 12.

Figure 5:
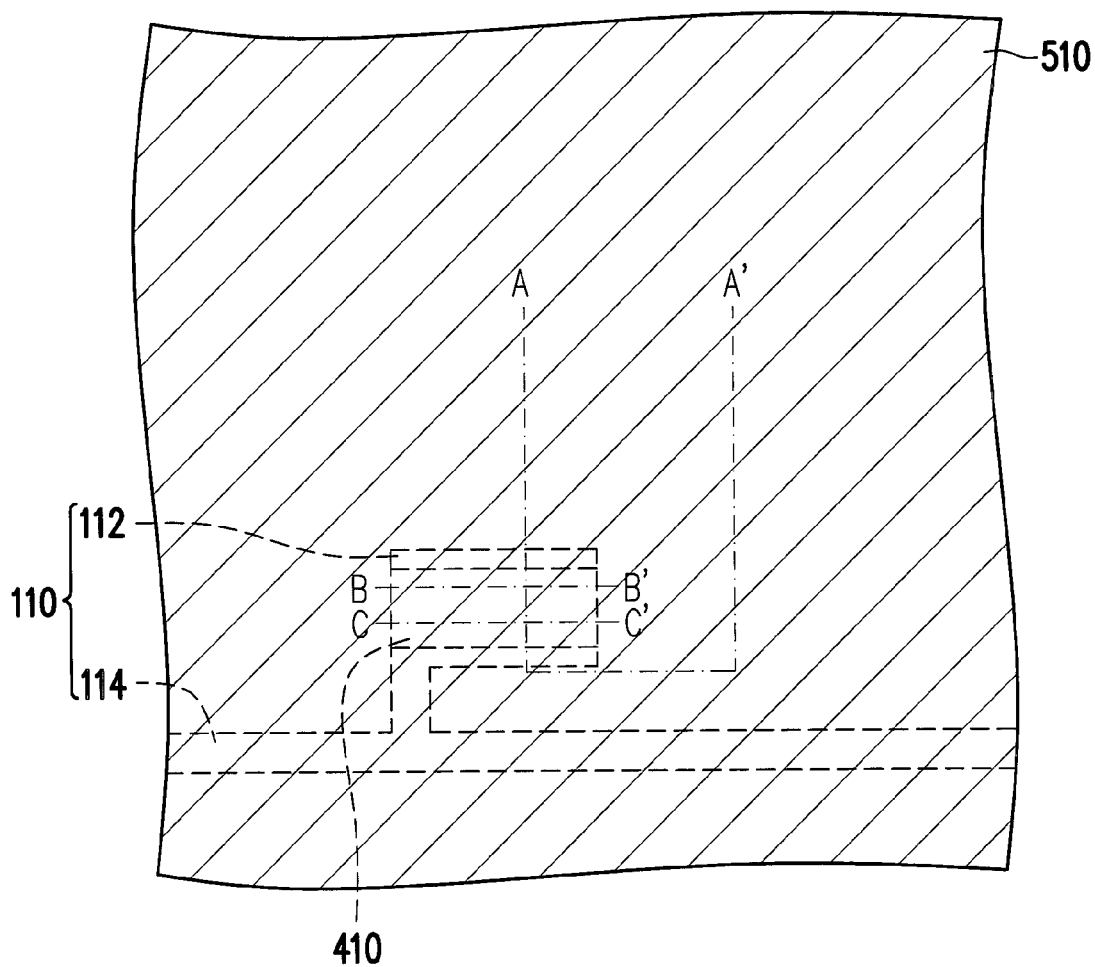
Figure 5A:
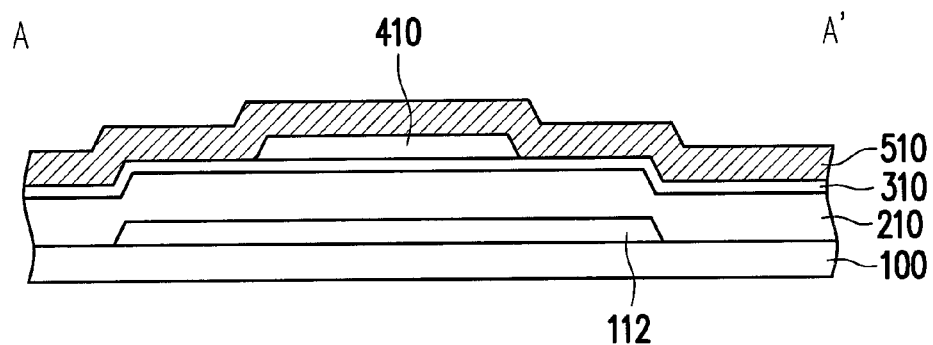
Figure 5B:
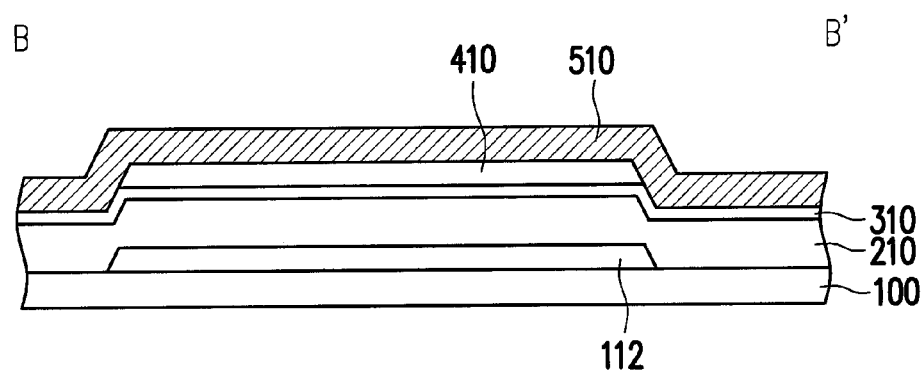
Figure 5C:
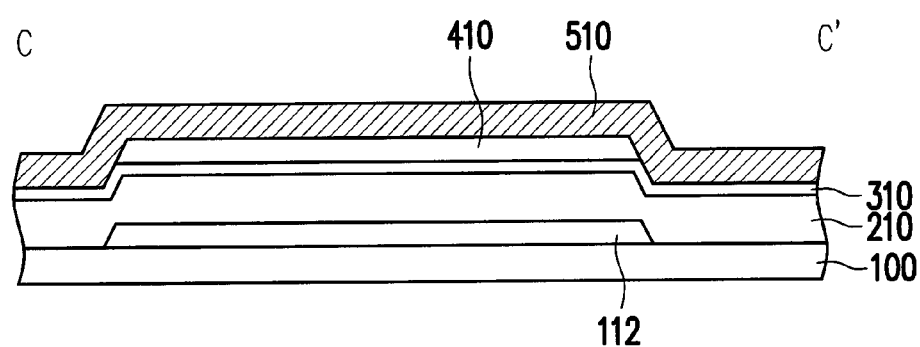

After the formation of the metal layer 510 as shown in FIG. 5, a patterned photoresist layer 810 is formed on the metal layer 510 and the semiconductor layer 310. According to FIG. 8, the patterned photoresist layer 810 includes a first photoresist pattern 812 and a second photoresist pattern 814, wherein the second photoresist pattern 814 completely surrounds the first photoresist pattern 812 and a thickness T1 of the first photoresist pattern 812 is greater than a thickness T2 of the second photoresist pattern 814 (as shown in FIGS. 8A through 8C).

Figure 8:
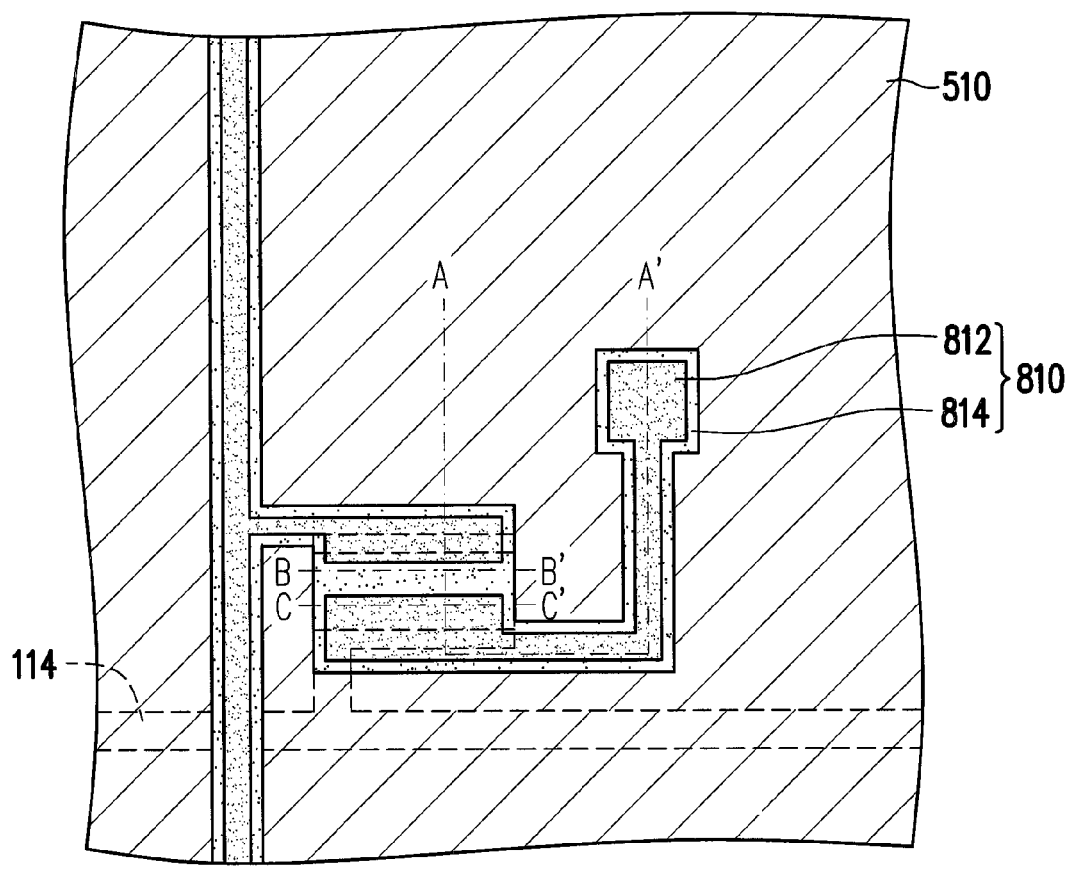
FIGS. 8 through 12 are schematic top views depicting the steps of a process for patterning the metal layer and the semiconductor layer according to an embodiment of the present invention.
Figure 8A:
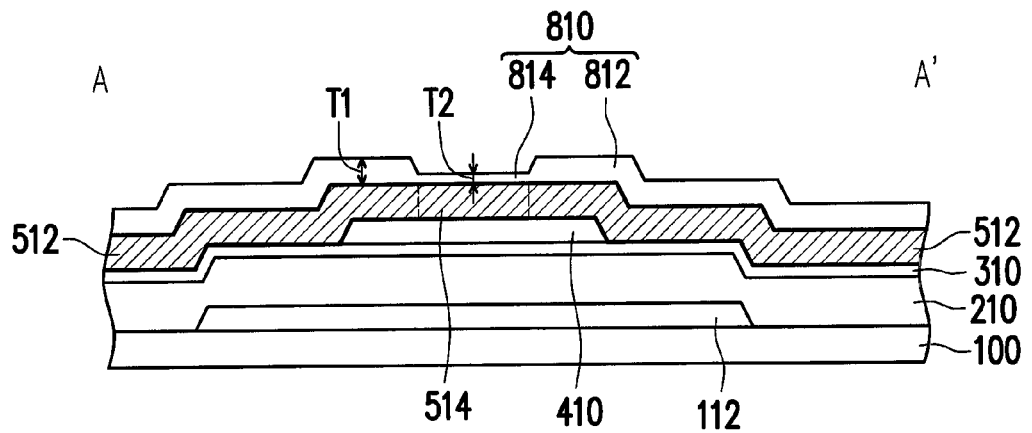
Figure 8B:
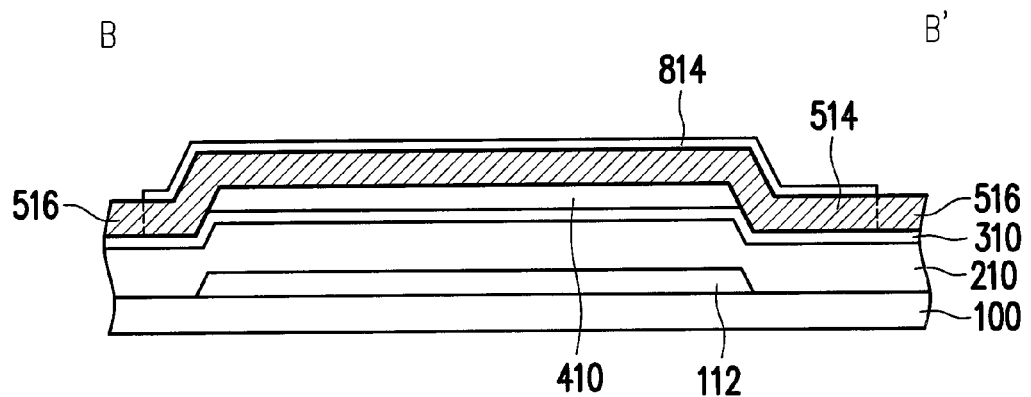
Figure 8C:
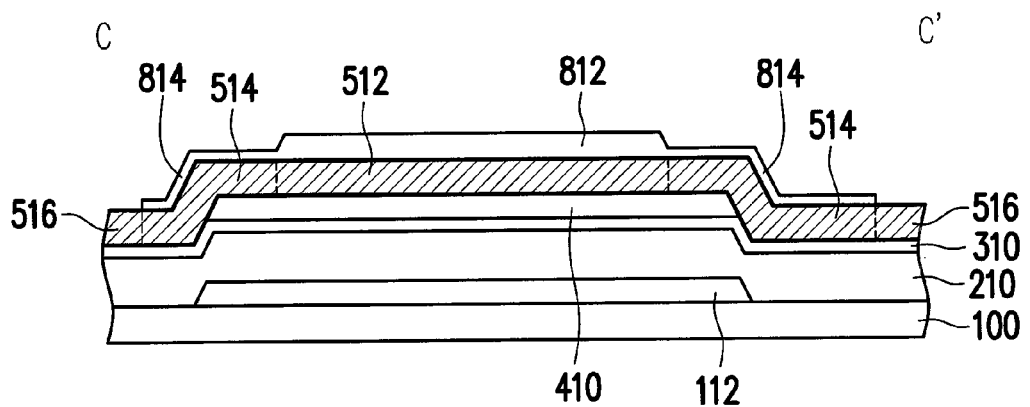

Referring to FIGS. 8A through 8C, the metal layer 510 can be divided into a first shielded portion 512 shielded by the first photoresist pattern 812, a second shielded portion 514 shielded by the second photoresist pattern 814, and an exposed portion 516 without being shielded. The first shielded portion 512 is predetermined to form the data line 612, the source 614, and the drain 616 as shown in FIG. 6. The second shielded portion 514 is located between the predetermined source 614 and the predetermined drain 616 and between the first shielded portion 512 and the exposing portion 516. In the present embodiment, the second shielded portion 514 can be a portion of the metal layer 510 extended outward from the first shielded portion 512 by 1 μm to 6 μm and the exposing portion 516 can be a portion of the metal layer 510 outside the first shielded portion 512 and the second shielded portion 514. Namely, the width of the second photoresist pattern 814 extended outward from the first photoresist pattern 812 can be 1 μm to 6 μm, but the invention is not restricted thereto.

Figure 9:
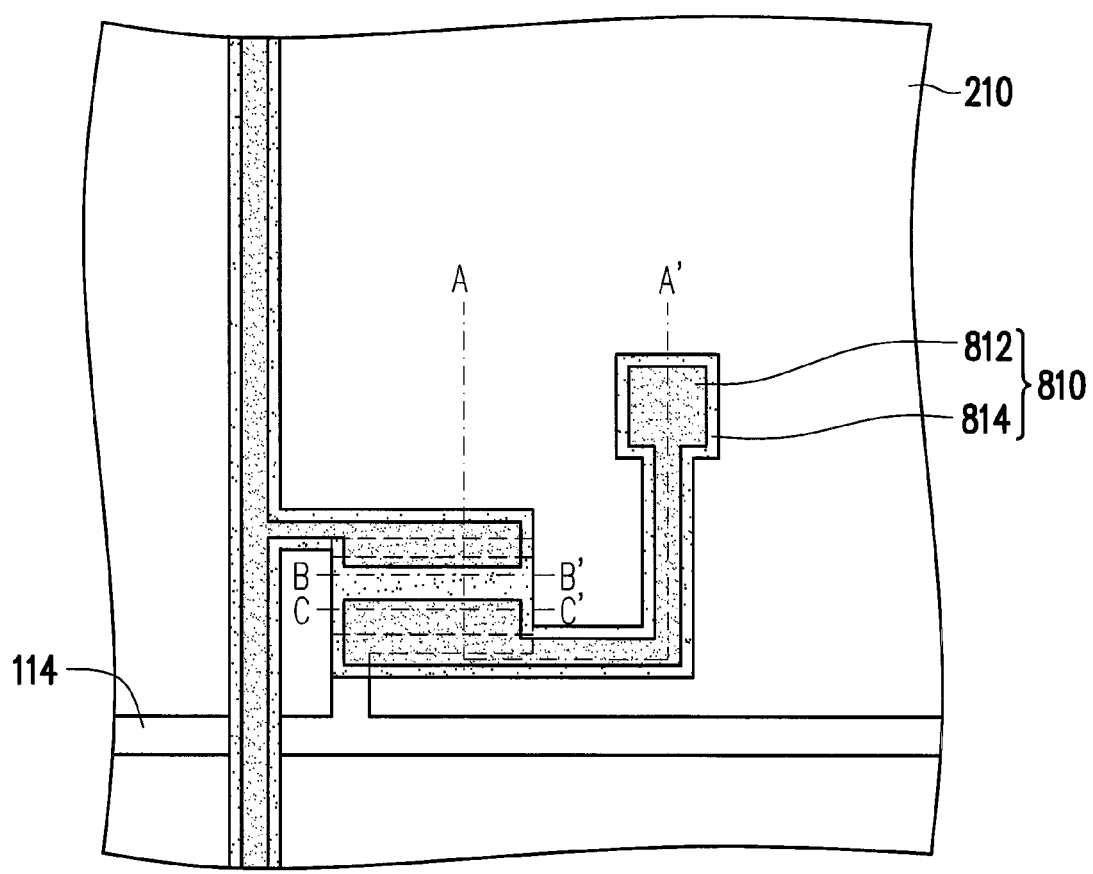
Figure 9A:
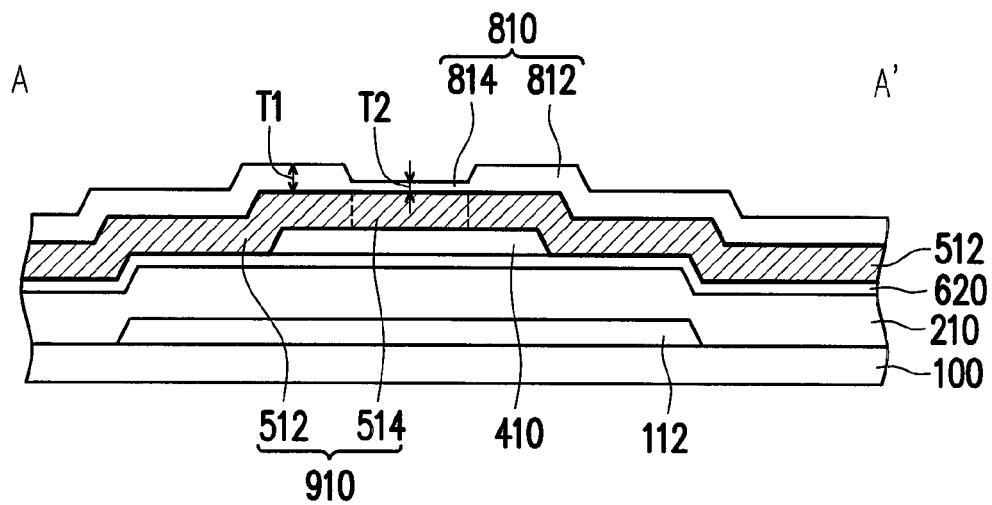

Next, as shown in FIG. 9, a first etching process is performed by using the patterned photoresist layer 810 as a mask to remove the exposing portion 516 and a portion of the semiconductor layer 310 under the exposing portion 516 and to simultaneously partially remove the second shielded portion 514 and another portion of the semiconductor layer 310 under the second shielded portion 514 to form a pre-patterned metal layer 910 and the patterned semiconductor layer 620. The components illustrated in FIG. 9A are located under the patterned photoresist layer 810 and thus are not etched during the performing of the first etching process. Accordingly, the drawing of FIG. 9A is substantially similar to the drawing of FIG. 8A.

In the first etching process, the method of removing a portion of the metal layer 510 and a portion of the semiconductor layer 310 can include performing a wet etching step, sequentially performing a dry etching step and a wet etching step, sequentially performing a wet etching step and a dry etching step, or performing a dry etching step. Specifically, during performing the first etching process, the etchant can partially remove the margin portion of the second shielded portion 514 and the margin portion of the semiconductor layer 310 under the second shielded portion 514 to form an undercut structure. Particularly, when the material of the semiconductor layer 310 is oxide, the etching selectivity ratio of the etchant between metal and the oxide semiconductor is not significant enough so that the forming of the undercut structure is not easily to be avoided. In addition, the etching selectivity ratio of the etchant is not good by using such materials, and thus the etching stop pattern 410 is configured between the metal material and the semiconductor material in the region predetermined to form the channel pattern in the present embodiment.

Figure 9B:
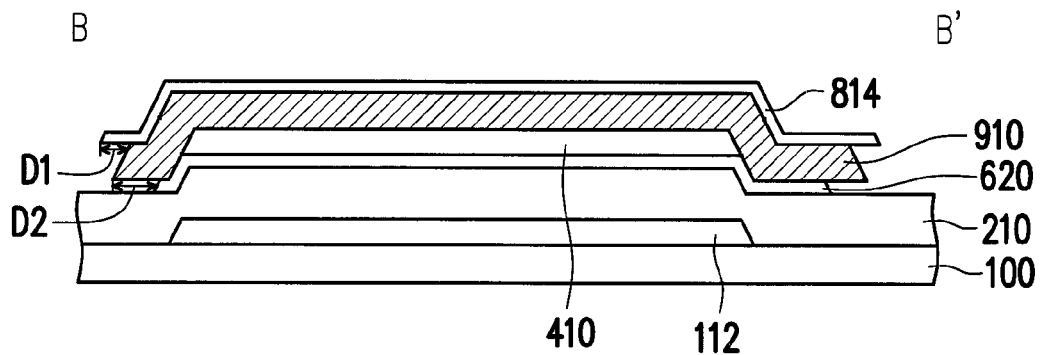
Figure 9C:
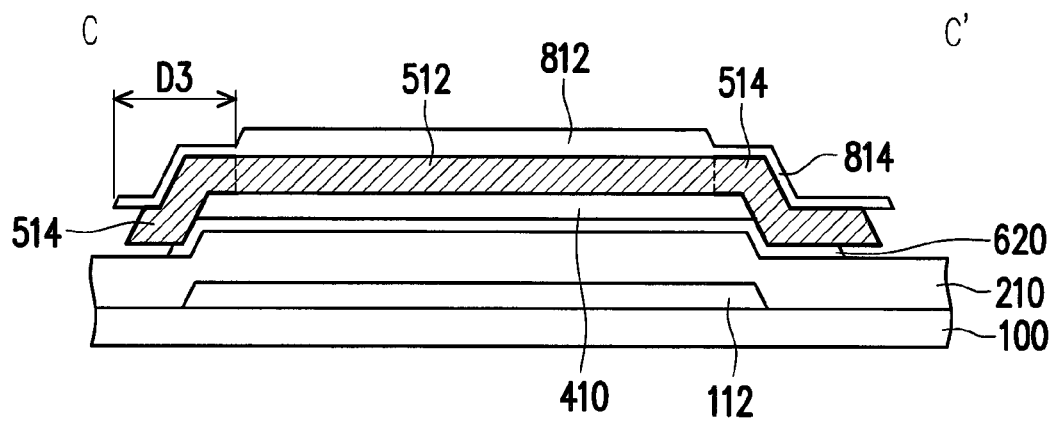

Furthermore, in FIG. 9B and FIG. 9C, the pre-patterned metal layer 910 shrinks relative to the second photoresist pattern 814 by a first distance D1 ranging from 1 μm to 6 μm and the patterned semiconductor layer 620 shrinks relative to the pre-patterned metal layer 910 by a second distance ranging from 0.2 μm to 2 μm. Accordingly, for eliminate the undercut structure by performing the following steps, a width D3 of the second photoresist pattern 814 extended outward from the first photoresist pattern 812 as shown in FIG. 9C is greater than a sum of the first distance D1 and the second distance D2. Certainly, the above-mentioned values are merely exemplary and should not be construed as limitations to this invention. In other embodiment, the shrinking distance of the film layer relative to another film layer can be modified based on the conditions of the etching process and the selection of the etchant.

Figure 10:
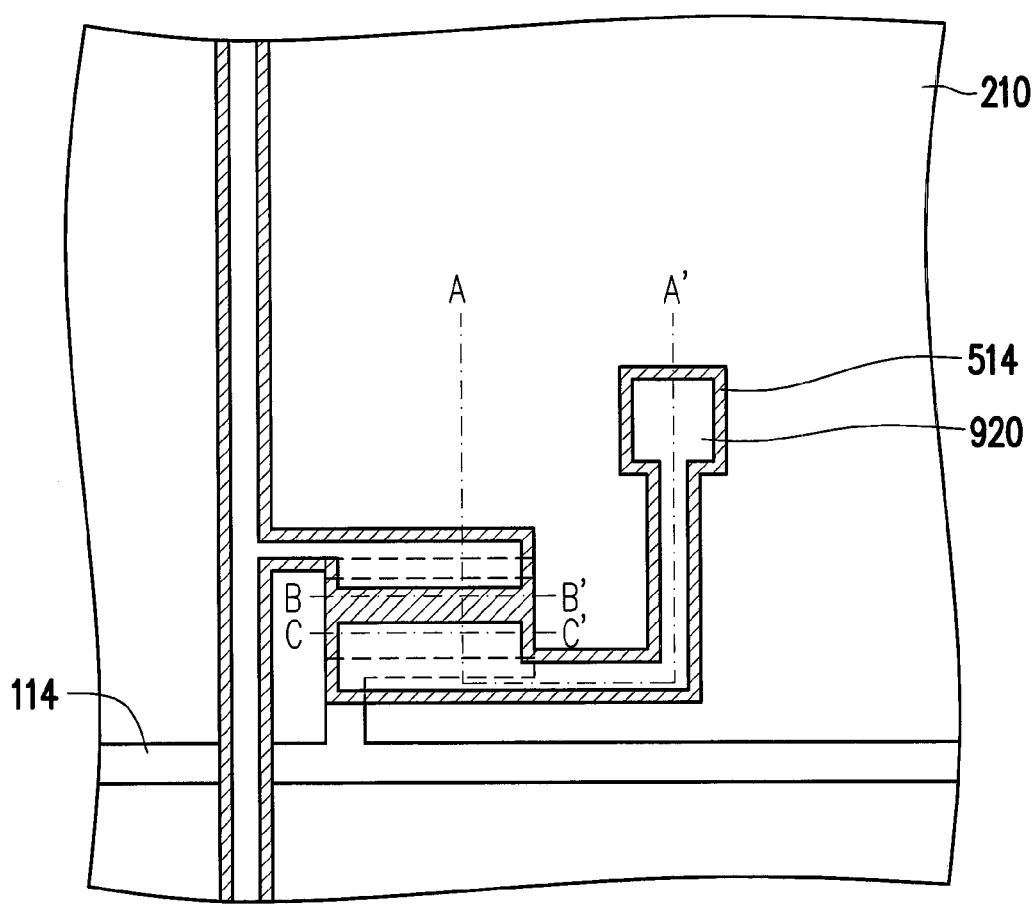
Figure 10A:
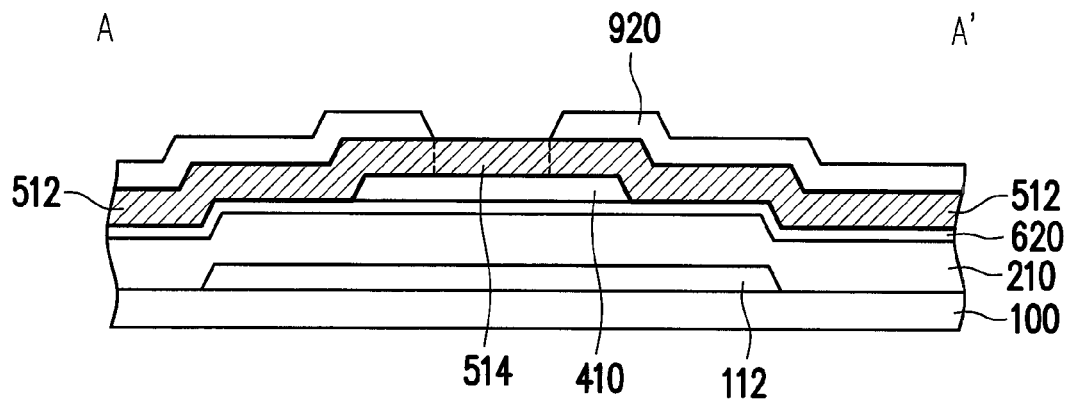
Figure 10B:
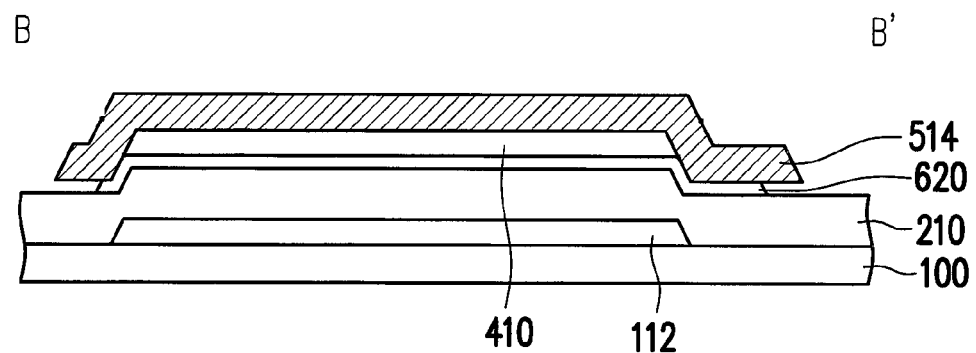
Figure 10C:
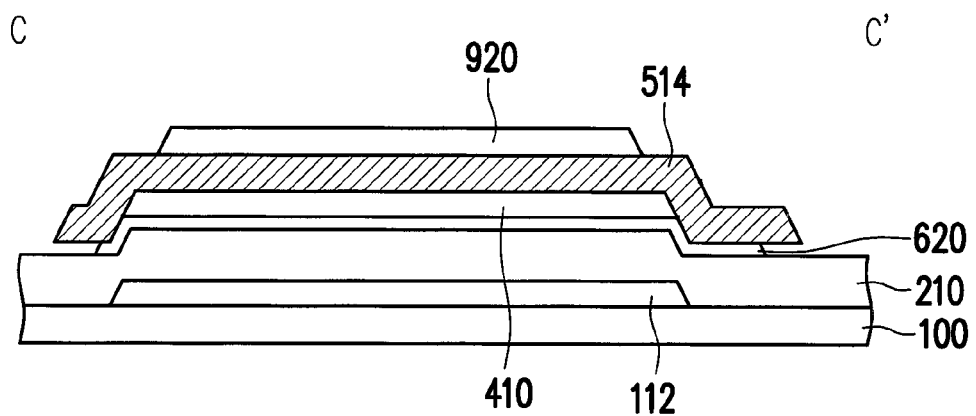

Then, as shown in FIG. 10, after forming the pre-patterned metal layer 910 and the patterned semiconductor layer 620, the second photoresist pattern 814 is removed and the first photoresist pattern 812 is thinned to form a third photoresist pattern 920 exposing the remained second shielded portion 514. The method of removing the second photoresist pattern 814 and thinning the first photoresist pattern 812 can be an ashing method. As shown in FIG. 10A, FIG. 10B, and FIG. 10C, no photoresist material is located above the channel pattern 626 and the photoresist material of the third photoresist pattern 920 is merely remained on the predetermined source 614 and the predetermined drain 616. Now, the second shielded portion 514 and the patterned semiconductor layer 620 still form the undercut structure.

Figure 11:
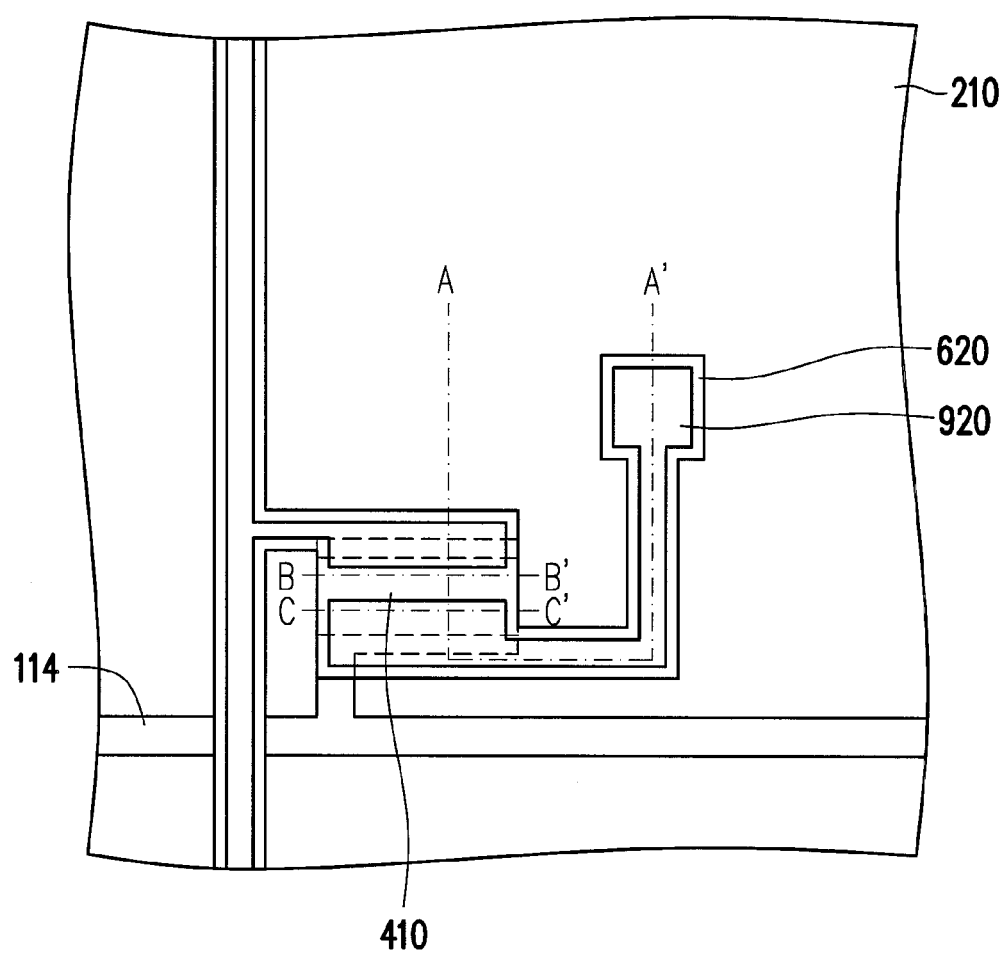
Figure 11A:
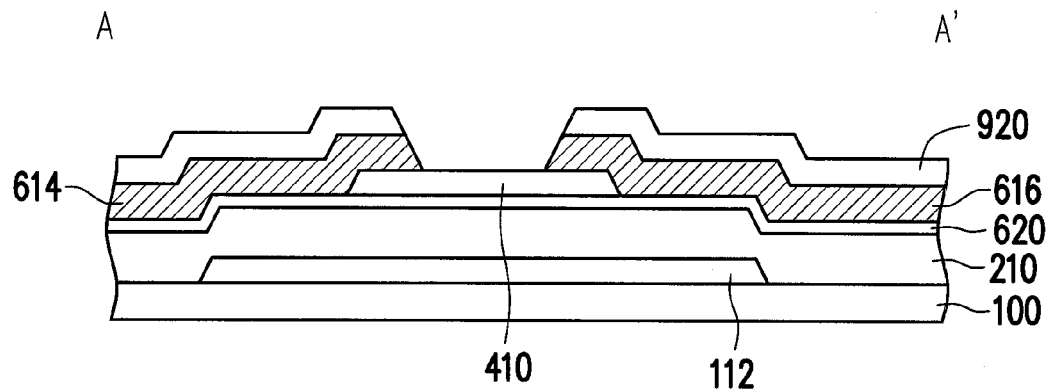
Figure 11B:
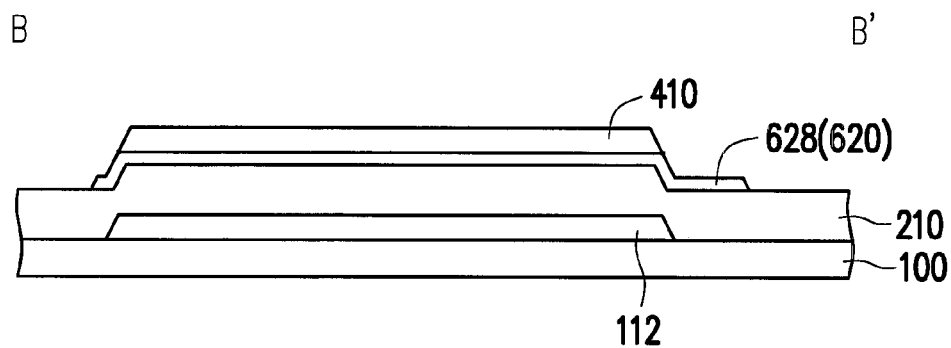
Figure 11C:
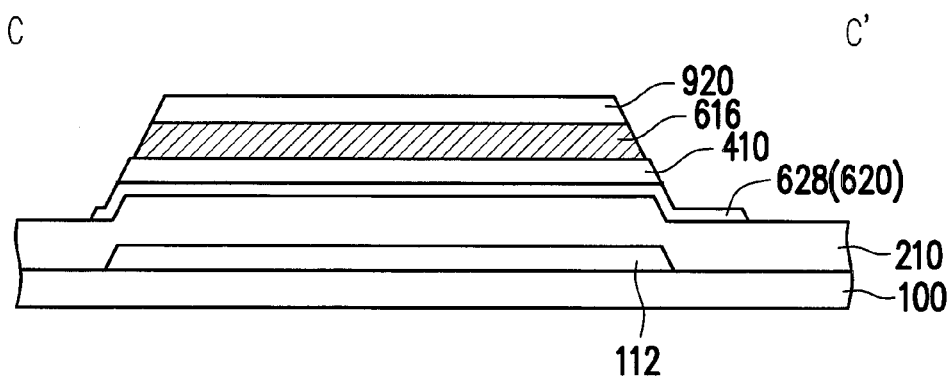

Thereafter, a second etching process is performed by using the third photoresist pattern 920 as a mask to remove the remained second shielded portion 514 to form the second patterned metal layer 610 as shown in FIG. 11. Referring to FIG. 11A, after performing the second etching process, the source 614 and the drain 616 are formed and they are separated from each other and located on the etching stop pattern 410 in a manner of opposite to each other. Further, as shown in FIG. 11B and FIG. 11C, the remained second shielding portion 514 is removed and the marginal pattern 628 of the patterned semiconductor layer 620 is exposed so that the under cut structure is eliminated in the cross-sectional views. Accordingly, the subsequent steps, such as the film formation steps in the fourth mask process or the fifth mask process, do not influence by the undercut structure, which prevents from the broken line effect and is conducive to the improvement of the fabrication yield rate in the present embodiment.

Figure 12:
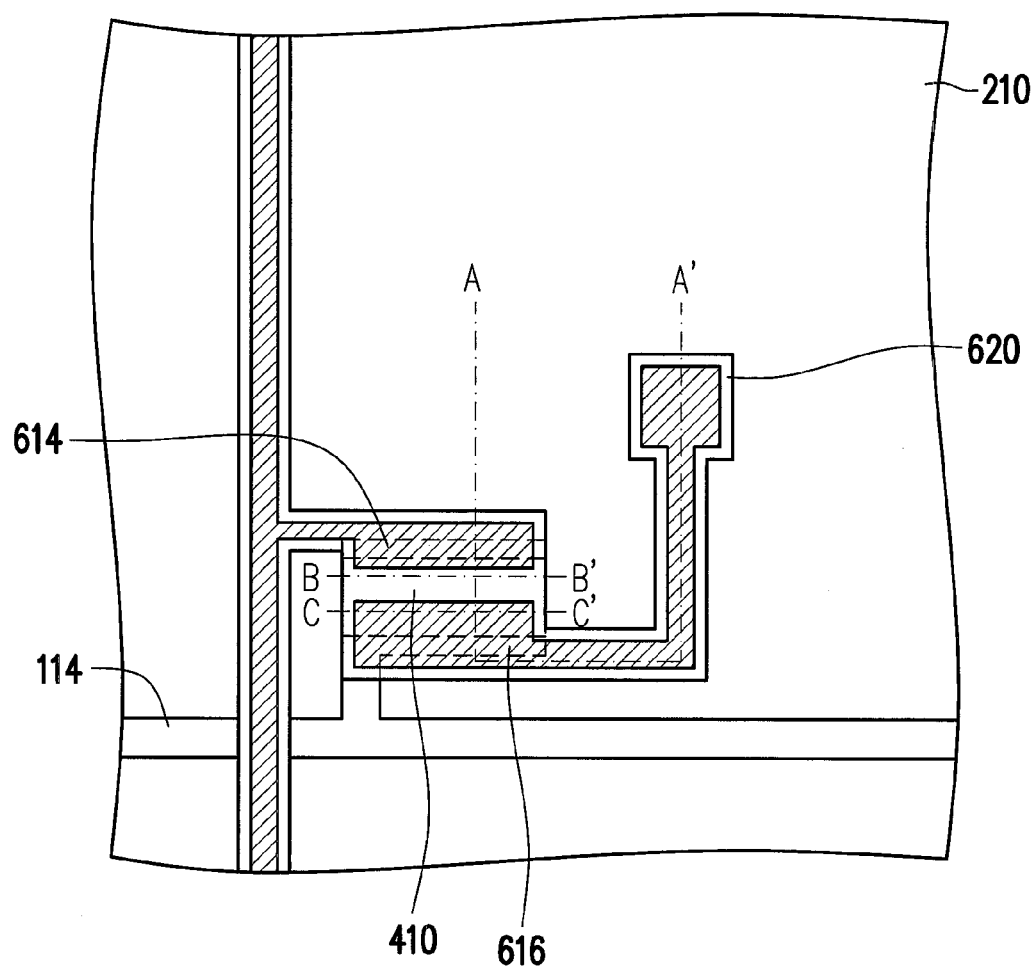
Figure 12A:
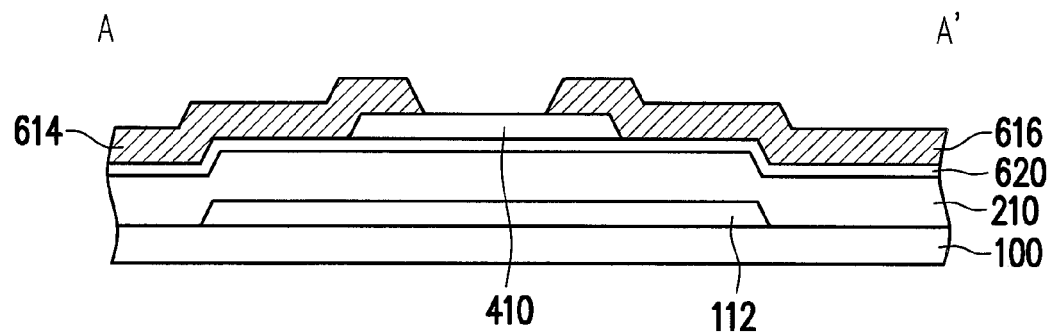
Figure 12B:
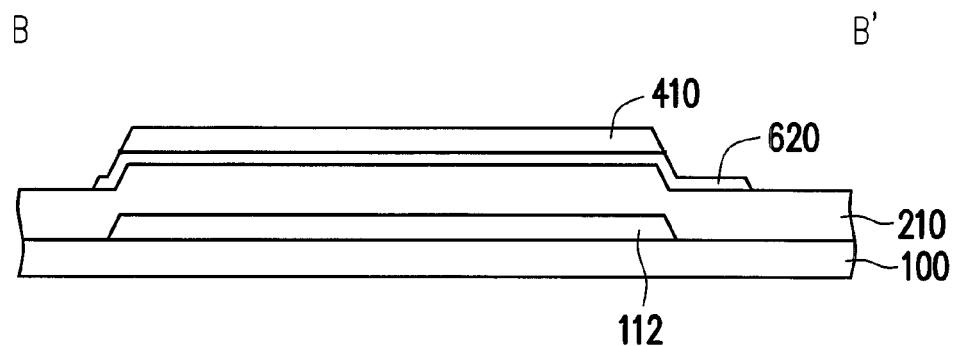
Figure 12C:
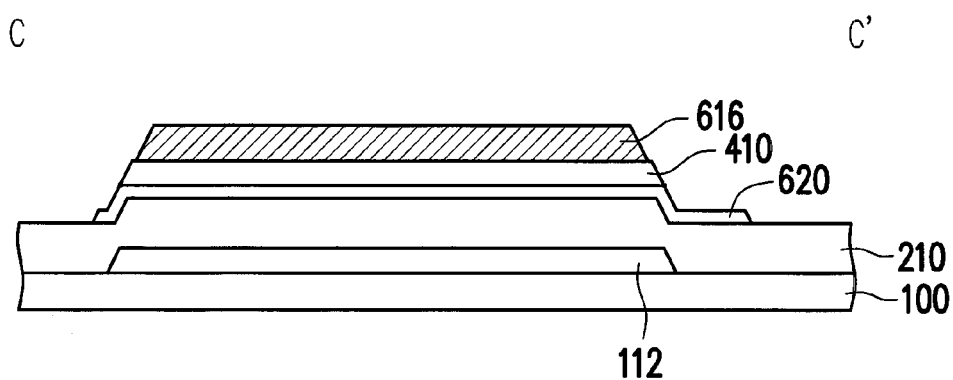

Subsequently, as shown in FIG. 12, the third photoresist pattern 920 is removed and the second patterned metal layer 610 and the patterned semiconductor layer 620 are finished. The structure depicted in FIG. 12B is similar to that depicted in FIG. 11B and the differences between FIG. 12A and FIG. 11A and between FIG. 12C and FIG. 11C mainly lie in the removing of the third photoresist pattern 920, and other components in FIG. 12A and FIG. 12C are respectively similar to those in FIG. 11A and FIG. 11C, which are not iterated here.

Figure 13:
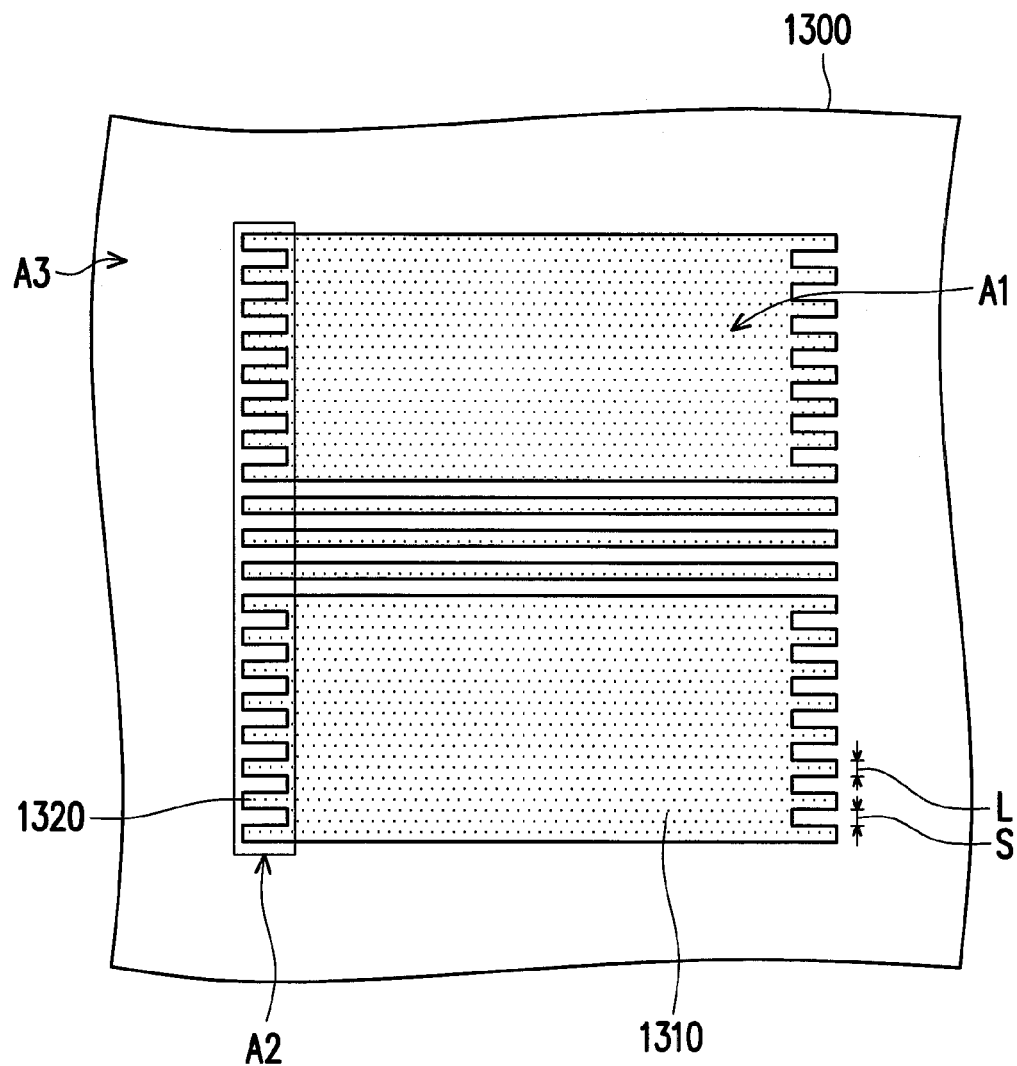
FIG. 13 through FIG. 15 are schematic views of photo masks for forming the patterned photoresist layer according to an embodiment of the present invention.
Figure 14:
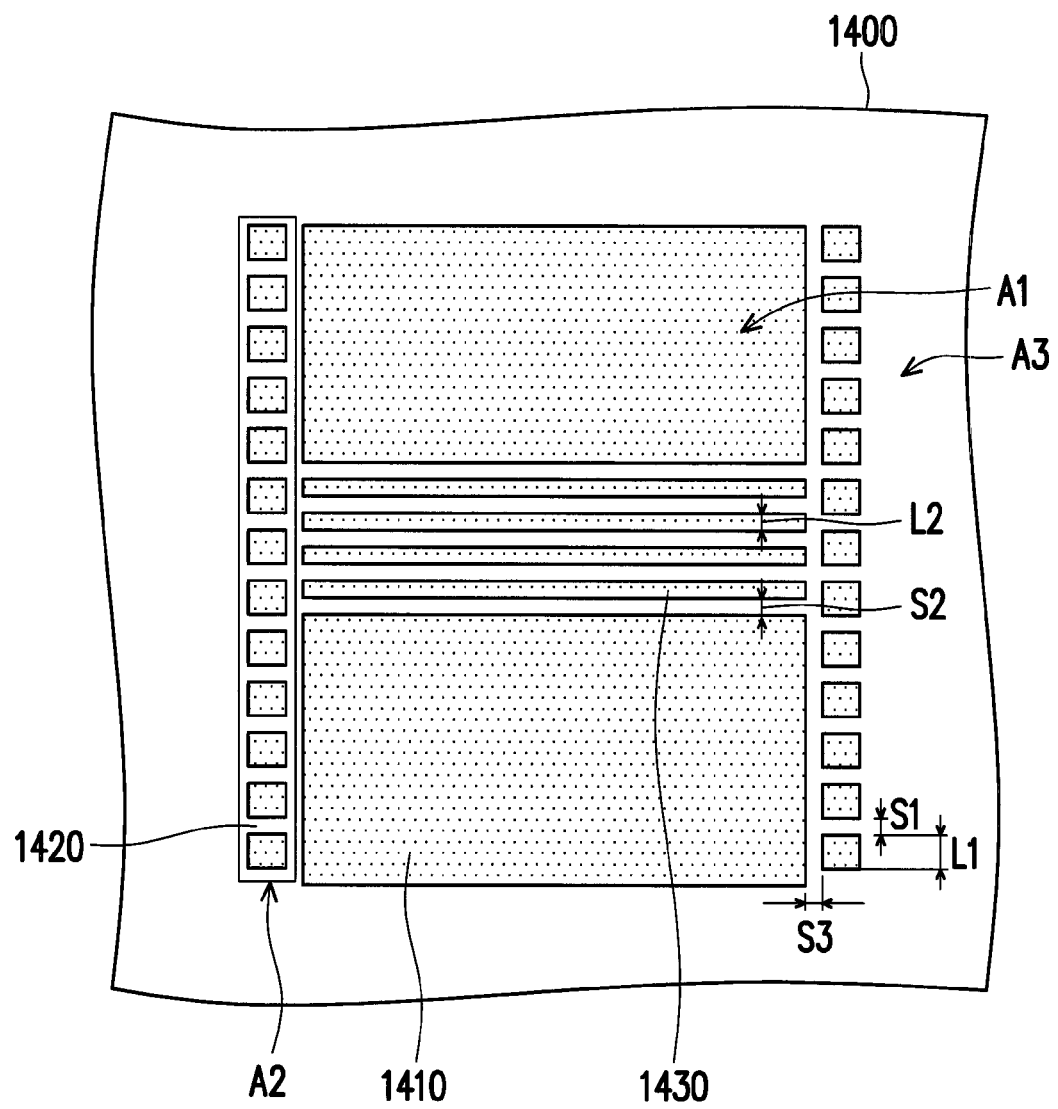
Figure 15:
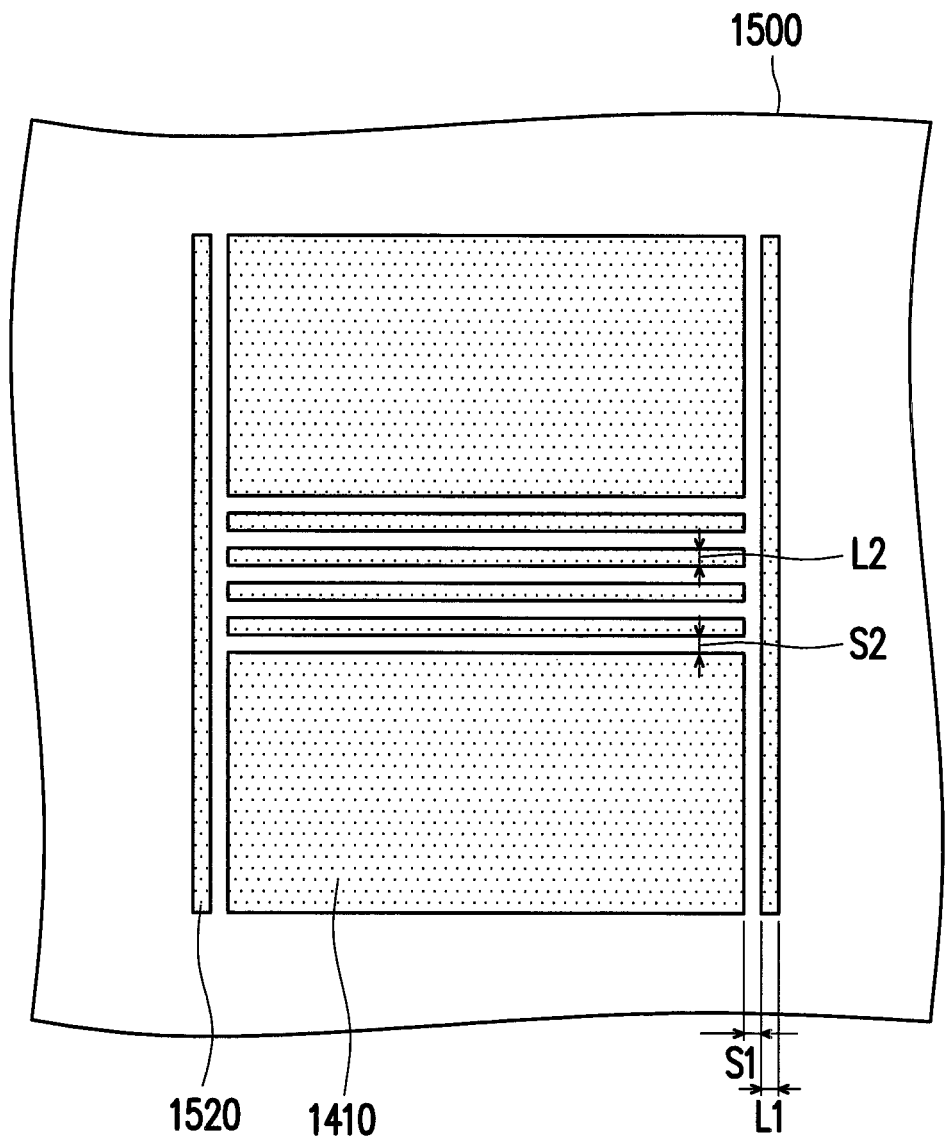

In specific, a method of forming the patterned photoresist layer 810 in the foregoing step includes performing a lithography process by using a photo mask to pattern a photoresist layer formed on the substrate and the photo mask includes a gray-level mask, a half-tone mask, a slit mask, or the like. FIG. 13 through FIG. 15 are schematic views of photo masks for forming the patterned photoresist layer of FIG. 8 according to an embodiment of the present invention.

Referring to FIG. 13 and FIG. 8 simultaneously, a photo mask 1300 can have a first transparent region A1, a second transparent region A2, and a third transparent region A3 with variant light transmittance, wherein the light transmittance of the second transparent region A2 is ranged between the light transmittance of the first transparent region A1 and the light transmittance of the third transparent region A3. Herein, the material of the patterned photoresist layer 810 can be a positive photoresist material and thus the photoresist layer can be patterned to respectively form the first photoresist pattern 812, the second photoresist pattern 814 and the rest area on the substrate 100 by different irradiation intensity of the light passing through the first transparent region A1, the second transparent region A2, and the third transparent region A3 in the photolithography process.

According to FIG. 13, the first transparent region A1, the second transparent region A2, and the third transparent region A3 can be defined by the first light shielding patterns 1310 and the second light shielding patterns 1320 in the photo mask 1300, wherein the third transparent region A3 can be defined by the region of the photo mask 1300 not shielded by the first light shielding patterns 1310 and the second light shielding patterns 1320. The first light shielding patterns 1310 can be, for example, continuous block patterns and correspondingly define the first transparent region A1 having the lowest light transmittance. Besides, the second light shielding patterns 1320 may connect with the margin of the first light shielding patterns 1310. In the present embodiment, a width L of the second light shielding pattern 1320 can be from 1 μm to 5 μm and the space S formed between the second light shielding patterns 1320 can be 1 μm to 3 μm so that the second transparent region A2 having the light transmittance between those of the first transparent region A1 and the third transparent region A3 is defined.

As shown in FIG. 14, a photo mask 1400, similar to the photo mask 1300 mentioned in above, has the first transparent region A1, the second transparent region A2, and the third transparent region A3. Nevertheless, the photo mask 1400 has the first light shielding patterns 1410, the second light shielding patterns 1420, and the third light shielding patterns 1430. The first light shielding patterns 1410 are continuous light shielding patterns with large area, and the second light shielding patterns 1420 and the third light shielding patterns 1430 surround the margin of the first light shielding patterns 1410.

The third light shielding patterns 1430 are served to define the region predetermined to form the channel patterns and are a plurality of stripe patterns. The second light shielding pattern 1420 may be a plurality of square patterns or rectangle patterns not connecting with the first light shielding patterns 1410. A width L1 of the second light shielding pattern 1420 and a width L2 of the third light shielding pattern 1430 can, for example, be 1 μm to 5 μm. A space S1 between the second light shielding patterns 1420 and a space S2 of the third light shielding patterns 1430 can, for example, be 1 μm to 3 μm.

In addition, as shown in FIG. 15, a photo mask 1500 can be modified from the photo mask 1400, wherein the second light shielding patterns 1420 in the photo mask 1400 is modified as the stripe second light shielding patterns 1520 to provide the required light transmittance, wherein a space S1 between the first light shielding patterns 1410 and the stripe second light shielding patterns 1520 can be 1 μm to 3 μm. The photo masks shown in FIGS. 13~15 are by no means construed as a limitation of the invention. Rather, in other embodiments, the patterns of the photo mask may be configured and arranged in a different manner.

In light of the foregoing, the same mask process is used for patterning the metal layer and the semiconductor layer according to the pixel structure and the fabrication method of the invention, and thus the conventional six mask processes for fabricating the pixel structure having the etching stop pattern can be simplified as the five mask processes of the invention. In addition, the semiconductor layer is not patterned before the formations of the etching stop pattern and the metal layer, and therefore, the shift between the semiconductor layer and the etching stop pattern existed in the conventional six mask processes is avoided so that the alignment between the semiconductor layer and the etching stop pattern is desirable. To be compared to the conventional technique of disposing one gate insulation layer between the gate and the source and between the gate and the drain, a semiconductor layer is further disposed between the gate and the source and between the gate and the drain in the present invention, which reduces the parasitic capacitances Cgs and Cgd by increasing the gap between the electrodes. Furthermore, the photoresist patterns with variant thickness are formed by transparent regions having variant light transmittance in the photo mask and two etching processes are performed to pattern the second metal layer and the semiconductor layer in the invention, which prevents from the undercut effect caused by merely performing one etching process to improve the fabrication yield rate of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A fabrication method of a pixel structure, comprising:
    forming a first patterned metal layer on a substrate, the first patterned metal layer comprising a scan line and a gate connected to the scan line;
    sequentially forming a first insulation layer, a semiconductor layer, and an etching stop pattern on the first patterned metal layer, and the etching stop pattern being located above the gate;
    forming a metal layer on the semiconductor layer and the etching stop pattern;
    patterning the metal layer and the semiconductor layer to form a second patterned metal layer and a patterned semiconductor layer, the second patterned metal layer comprising a data line, a source, and a drain, an extension direction of the data line intersecting an extension direction of the scan line, the source and the drain being opposite to each other and located on the etching stop pattern, the patterned semiconductor layer comprising a first semiconductor pattern completely overlapped with the second patterned metal layer and a second semiconductor pattern not overlapped with the second patterned metal layer, wherein the second semiconductor pattern comprises a channel pattern located between the source and the drain and a marginal pattern surrounding the first semiconductor pattern;
    forming a second insulation layer on the substrate and forming a contact opening exposing the drain in the second insulation layer; and forming a pixel electrode on the second insulation layer, the pixel electrode being electrically connected to the drain via the contact, wherein a method of patterning the metal layer and the semiconductor layer comprises:

forming a patterned photoresist layer on the metal layer and the semiconductor layer, the patterned photoresist layer comprising a first photoresist pattern and a second photoresist pattern, a thickness of the first photoresist pattern being greater than a thickness of the second photoresist pattern, and the second photoresist pattern surrounding the first photoresist pattern;

performing a first etching process by using the patterned photoresist layer as a mask to remove an exposed portion of the metal layer and a portion of the semiconductor layer under the exposed portion of the metal layer to form a pre-patterned metal layer and the patterned semiconductor layer;

removing the second photoresist pattern and thinning the first photoresist pattern to form a third photoresist pattern exposing a portion of the pre-patterned metal layer;

performing a second etching process by using the third photoresist pattern as a mask to remove the exposed portion of the pre-patterned metal layer for forming the second patterned metal layer; and opening.

2. The fabrication method of the pixel structure as claimed in claim 1, wherein a method of patterning the metal layer and the semiconductor layer comprises:

forming a patterned photoresist layer on the metal layer and the semiconductor layer, the patterned photoresist layer comprising a first photoresist pattern and a second photoresist pattern, a thickness of the first photoresist pattern being greater than a thickness of the second photoresist pattern, and the second photoresist pattern surrounding the first photoresist pattern;

performing a first etching process by using the patterned photoresist layer as a mask to remove an exposed portion of the metal layer and a portion of the semiconductor layer under the exposed portion of the metal layer to form a pre-patterned metal layer and the patterned semiconductor layer;

removing the second photoresist pattern and thinning the first photoresist pattern to form a third photoresist pattern exposing a portion of the pre-patterned metal layer;

performing a second etching process by using the third photoresist pattern as a mask to remove the exposed portion of the pre-patterned metal layer for forming the second patterned metal layer; and removing the third photoresist pattern.

3. The fabrication method of the pixel structure as claimed in claim 1, wherein the pre-patterned metal layer shrinks relative to the patterned photoresist layer by a first distance and the patterned semiconductor layer shrinks relative to the pre-patterned metal layer by a second distance.

4. The fabrication method of the pixel structure as claimed in claim 3, wherein a width of the second photoresist pattern extended outward from the first photoresist pattern is greater than a sum of the first distance and the second distance.

5. The fabrication method of the pixel structure as claimed in claim 3, wherein the first distance is from 1 μm to 6 μm and the second distance is from 0.2 μm to 2 μm.

6. The fabrication method of the pixel structure as claimed in claim 1, wherein a method of forming the patterned photoresist layer comprises performing a photolithography process by using a photo mask to pattern a photoresist layer formed on the substrate and the photo mask comprises a gray-level mask, a half-tone mask, or a slit mask.

7. The fabrication method of the pixel structure as claimed in claim 6, wherein the photo mask has a first transparent region, a second transparent region, and a third transparent region with variant light transmittance, and a light passes the first transparent region, the second transparent region, and the third transparent region to pattern the photoresist for respectively forming the first photoresist pattern and the second photoresist pattern during the photolithography process.

8. The fabrication method of the pixel structure as claimed in claim 7, wherein a light transmittance of the second transparent region is ranged between a light transmittance of the first transparent region and a light transmittance of the third transparent region.

9. The fabrication method of the pixel structure as claimed in claim 1, wherein the marginal pattern substantially extends outward from the first semiconductor pattern by 1 μm to 6 μm.

10. The fabrication method of the pixel structure as claimed in claim 1, wherein an area of the patterned semiconductor layer is larger than an area of the second patterned metal layer.

11. The fabrication method of the pixel structure as claimed in claim 1, wherein the second patterned metal layer and the patterned semiconductor layer are substantially in contact with each other.

* * * * *